(12) United States Patent
Lazarus et al.

(10) Patent No.: US 6,781,285 B1
(45) Date of Patent: Aug. 24, 2004

(54) PACKAGED STRAIN ACTUATOR

(75) Inventors: Kenneth B. Lazarus, Concord, MA (US); Mark E. Lundstrom, Seattle, WA (US); Jeffrey W. Moore, Arlington, MA (US); Edward Crawley, Cambridge, MA (US); Farla Russo, Brookline, MA (US); Shoko Yoshikawa, Cambridge, MA (US); Eric Fitch, Medford, MA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/300,137

(22) Filed: Apr. 27, 1999

Related U.S. Application Data

(63) Continuation-in-part of application No. 09/261,475, filed on Feb. 26, 1999, now Pat. No. 6,404,107, which is a continuation-in-part of application No. 08/943,645, filed on Oct. 3, 1997, now Pat. No. 6,069,433, which is a continuation of application No. 08/188,145, filed on Jan. 27, 1994, now Pat. No. 6,420,819.

(51) Int. Cl.[7] .............................................. H01L 41/08
(52) U.S. Cl. ...................................... 310/332; 310/340
(58) Field of Search ............................... 310/330–332, 310/328, 327, 359

(56) References Cited

U.S. PATENT DOCUMENTS

| | | | | |
|---|---|---|---|---|
| 2,352,311 A | * | 6/1944 | Toro ........................... | 310/330 |
| 2,540,194 A | * | 2/1951 | Ellett ...................... | 310/332 X |
| 3,365,592 A | * | 1/1968 | Krautwald et al. ...... | 310/332 X |
| 3,582,691 A | | 6/1971 | Sonderegger et al. ........ | 310/328 |
| 4,054,808 A | | 10/1977 | Tanaka ......................... | 310/366 |
| 4,099,211 A | * | 7/1978 | Hathaway ............... | 310/332 X |
| 4,240,002 A | | 12/1980 | Tosi et al. .................... | 310/324 |
| 4,363,991 A | | 12/1982 | Edelman ...................... | 310/338 |
| 4,400,642 A | * | 8/1983 | Kiraly ......................... | 310/332 |

(List continued on next page.)

FOREIGN PATENT DOCUMENTS

| | | |
|---|---|---|
| EP | 0 005 265 | 11/1979 |
| WO | WO 91/12953 | 9/1991 |

OTHER PUBLICATIONS

R/flex Circuit Materials Product Data Sheet DS209031, "Flex–I–MID 3000, High Performance Adhesiveless Circuit Materials", by Rogers Corporation, Microwave and Circuit Materials Division.

*Primary Examiner*—Mark Budd
(74) *Attorney, Agent, or Firm*—William Cray

(57) ABSTRACT

A modular actuator assembly includes one or more plates or elements of electro-active material bonded to an electroded sheet, preferably by a structural polymer to form a card. The card is sealed, and may itself constitute a practical device, such as a vane, shaker, stirrer, lever, pusher or sonicator for direct contact with a solid or immersion in a fluid, or may be bonded by a stiff adhesive to make a surface-to-surface mechanical coupling with a solid workpiece, device, substrate machine or sample. The structural polymer provides a bending stiffness such that the thin plate does not deform to its breaking point, and a mechanical stiffness such that shear forces are efficiently coupled from the plate to the workpiece. In further embodiments, the card may include active circuit elements for switching, powering or processing signals, and/or passive circuit elements for filtering, matching or damping signals, so that few or no connections to outside circuitry are required. The actuator assembly can be manufactured in quantity, to provide a versatile actuator with uniform mechanical and actuation characteristics, that introduces negligible mass loading to the workpiece. The cards themselves may be arranged as independent mechanical actuators, rather tan strain-transfer actuators, in which the induced strain changes the position of the card. Various arrangements of pinned or cantilevered cards may act as a pusher, bender or other motive actuator, and structures such as powered bellows may be formed directly by folding one or more suitably patterned cards.

1 Claim, 18 Drawing Sheets

U.S. PATENT DOCUMENTS

| | | | |
|---|---|---|---|
| 4,461,179 A | 7/1984 | Holt | 73/658 |
| 4,578,611 A | 3/1986 | Sadler | 310/338 |
| 4,611,141 A | 9/1986 | Mahada et al. | 310/334 |
| 4,651,310 A | 3/1987 | Kaneko et al. | 310/800 |
| 4,680,595 A | 7/1987 | Cruz-Uribe et al. | 346/140 |
| 4,732,351 A | 3/1988 | Bird | 310/800 |
| 4,761,582 A | 8/1988 | McKee | 310/322 |
| 4,812,698 A * | 3/1989 | Chida et al. | 310/330 |
| 4,849,668 A * | 7/1989 | Crawley et al. | 310/328 |
| 4,857,887 A | 8/1989 | Iten | 310/340 |
| 4,864,179 A | 9/1989 | Lapetina et al. | 310/366 |
| 4,914,565 A | 4/1990 | Schnoeller et al. | 310/366 |
| 4,939,405 A * | 7/1990 | Okuyama et al. | 310/332 |
| 5,101,278 A * | 3/1992 | Itsumi et al. | 310/332 X |
| 5,305,507 A | 4/1994 | Dvorsky et al. | 310/340 |
| 5,315,203 A | 5/1994 | Bicos | 310/358 |
| 5,415,175 A | 5/1995 | Hanafy et al. | 128/662.03 |
| 5,438,998 A | 8/1995 | Hanafy | 128/662.03 |
| 5,493,541 A | 2/1996 | Snyder | 367/155 |
| 5,632,841 A | 5/1997 | Hellbaum et al. | |
| 5,656,882 A * | 8/1997 | Lazarus et al. | 310/332 |

\* cited by examiner

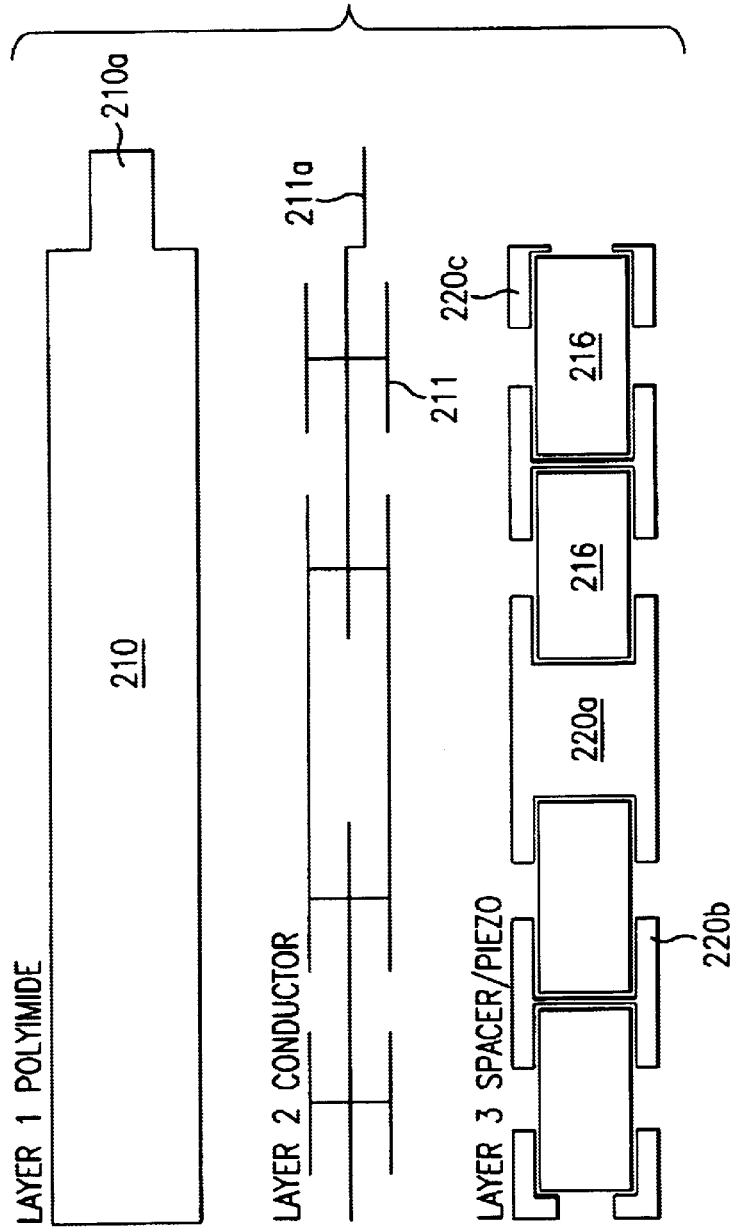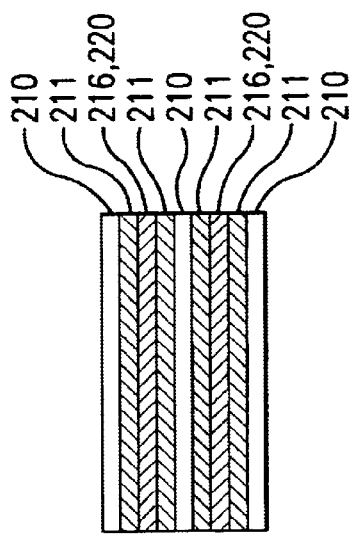

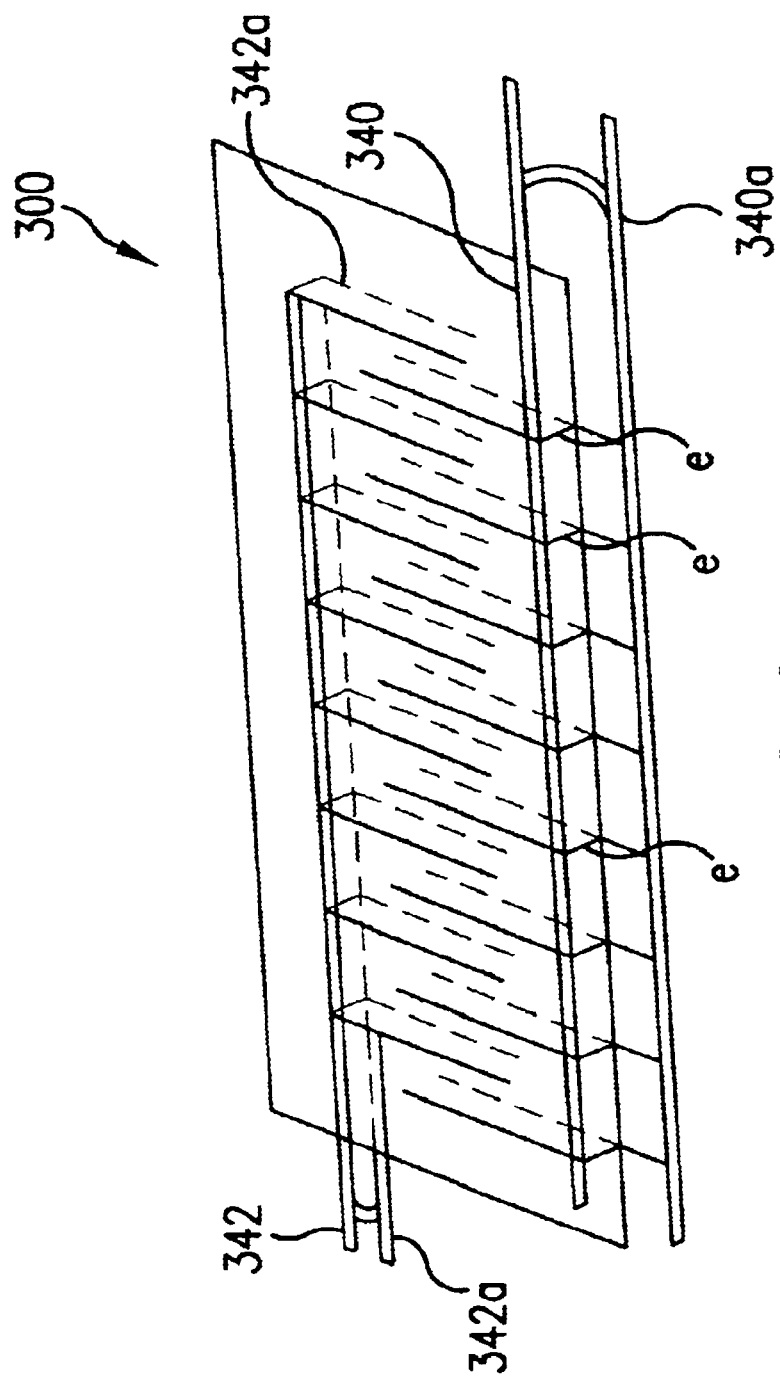

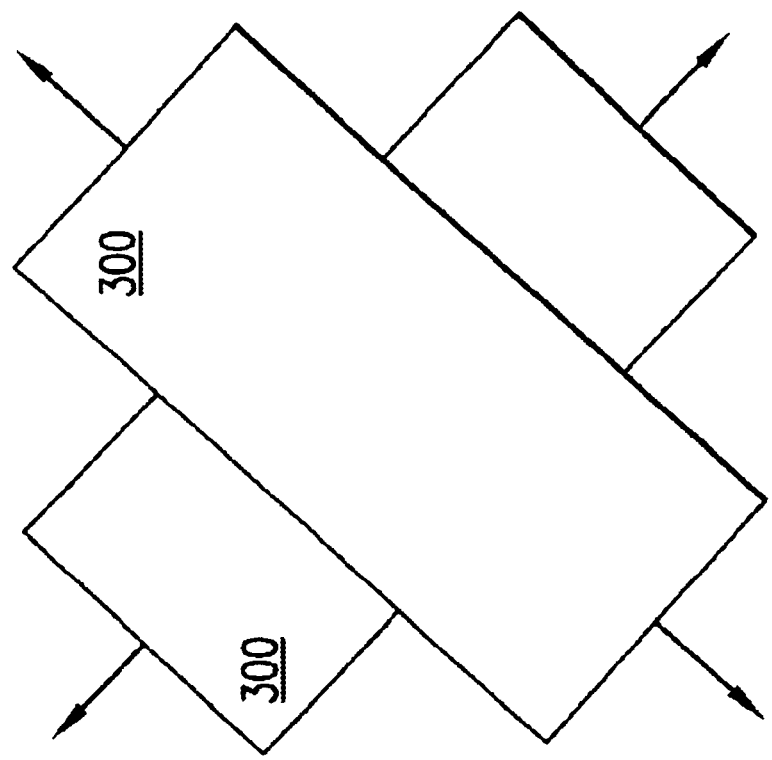

SINGLE ACTUATORS:
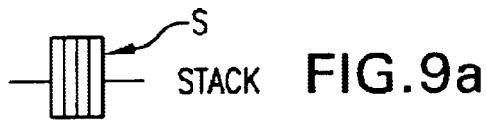
STACK FIG.9a
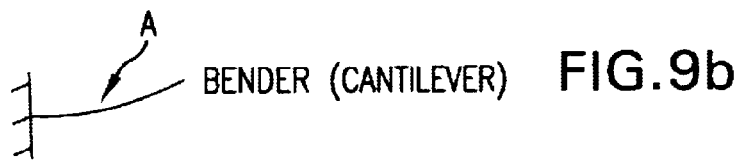
BENDER (CANTILEVER) FIG.9b
PIN PIN BENDER FIG.9c
MULTIPLE ACTUATORS:
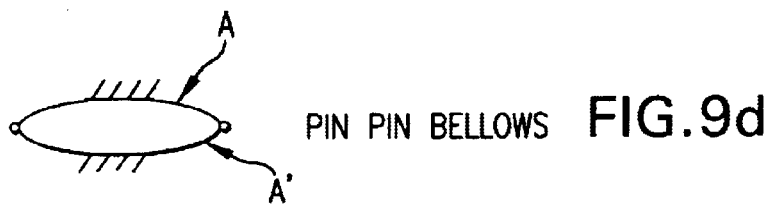
PIN PIN BELLOWS FIG.9d
MULTIPLE PIN PIN BELLOWS FIG.9e
PIN PIN WITH LEVER FIG.9f
PIN PIN WITH CANTILEVER BENDER FIG.9g
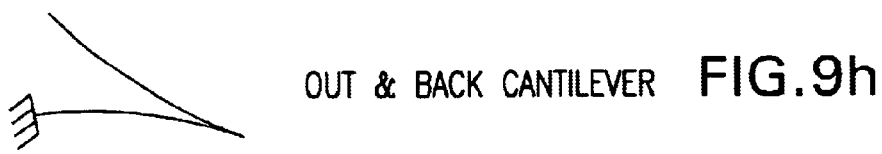
OUT & BACK CANTILEVER FIG.9h IN CONJUCTION WITH BENDER-LEVERS;
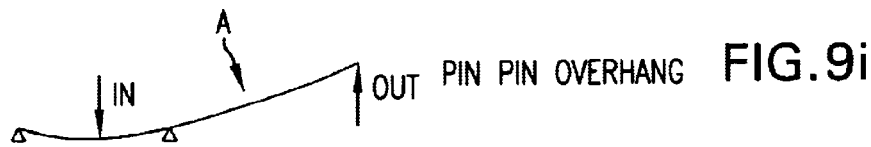
FIG.9i PIN PIN OVERHANG
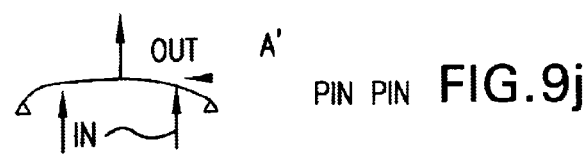
FIG.9j PIN PIN
FIG.9k CANTILEVER
FIG.9l PIN PIN WITH SOFT POINTS
MULTIPLE ACTUATOR/BENDER LEVERS:
CANTILEVER BINDER + CANTILEVER LEVER
FIG.9m
OUT & BACK CANTILEVER BENDER + CANTILEVER LEVER
FIG.9n
PIN PIN BELLOWS + PIN PIN OVERHANG
FIG.9o
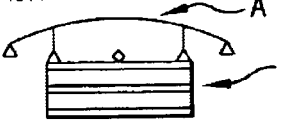
STACK + PIN PIN
FIG.9p
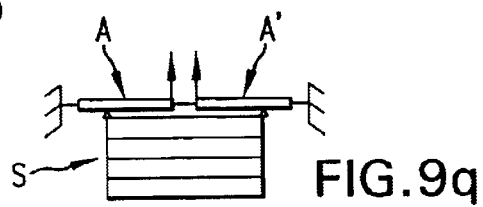
FIG.9q

PACKAGED STRAIN ACTUATOR

RELATED APPLICATION

This application is a continuation in part of application Ser. No. 09/261,475, now U.S. Pat No. 6,404,107 which is a continuation-in-part of application Ser. No. 08/943,645, filed Oct. 3, 1997, now U.S. Pat No. 6,069,433 which is a continuation of application Ser. No. 08/188,145, filed Jan. 27, 1994 now U.S. Pat No. 6,420,819.

BACKGROUND OF THE INVENTION

The present invention relates to actuator elements such as may be used for active vibration reduction, structural control, dynamic testing, precision positioning, motion control, stirring, shaking, and passive or active damping. More particularly, the present invention relates to a packaged actuator assembly that is electronically controllable and may be used separately or adapted to actively suppress vibration, actuate structures, or damp mechanical states of a device to which it is attached. As described in a subsequent section below, the assembly may be bonded or attached to a structure or system, thereby integrating it with the system to be actuated, controlled or damped.

Smart materials, such as piezoelectric, electostrictive or magnetostrictive materials, may be used for high band width tasks such as actuation or damping of structural or acoustic noise, and also for precision positioning applications. Such applications frequently require that the smart material be bonded or attached to the structure that it is to control. However, general purpose actuators of these materials are not generally available, and typically a person wishing to implement such a control task must take raw, possibly non-electroded, smart material stock, together with any necessary electrodes, adhesives and insulating structures and proceed to fasten it onto, or incorporate it into, the article of interest.

For such applications, it becomes necessary to connect and attach these materials in such a way that the mechanical and electrical connections to the smart material are robust and capable of creating strain within the smart member or displacing or forcing the system, and to couple this strain, motion or force to the object which is to be controlled. Often, it is required that the smart material be used in a non-benign environment, greatly increasing the chances of its mechanical or electrical failure.

By way of example, one such application, that of vibration suppression and actuation for a structure, requires attachment of a piezoelectric element (or multiple elements) to the structure. These elements are then actuated, the piezoelectric effect transforming electrical energy applied to the elements into mechanical energy that is distributed throughout the elements. By selectively creating mechanical impulses or changing strain within the piezoelectric material, specific shape control of the underlying structure is achievable. Rapid actuation can be used to suppress a natural vibration or to apply a controlled vibration or displacement. Examples of this application of piezoelectric and other intelligent materials have become increasingly common in recent years.

In a typical vibration suppression and actuation application, a piezoelectric element is bonded to a structure in a complex sequence of steps. The surface of the structure is first machined so that one or more channels are created to carry electrical leads needed to connect to the piezoelectric element Alternatively, instead of machining channels, two different epoxies may be used to make both the mechanical and the electrical contacts. In this alternative approach, a conductive epoxy is spotted, i.e., applied locally to form conductors, and a structural epoxy is applied to the rest of the structure, bonding the piezoelectric element to the structure. Everything is then covered with a protective coating.

This assembly procedure is labor intensive, and often involves much rework due to problems in working with the epoxy. Mechanical uniformity between different piezoelectric elements is difficult to obtain due to the variability of the process, especially with regard to alignment and bonding of the piezoelectric elements. Electrical and mechanical connections formed in this way are often unreliable. It is common for the conductive epoxy to flow in an undesirable way, causing a short across the ends of the piezoelectric element. Furthermore, piezoelectric elements are very fragile and when unsupported may be broken during bonding or handling.

Another drawback of the conventional fabrication process is that after the piezoelectric element is bonded to the structure, if fracture occurs, that part of the piezoelectric element which is not in contact with the conductor is disabled. Full actuation of the element is thereby degraded. Shielding also can be a problem since other circuit components as well as personnel must generally be shielded from the electrodes of these devices, which may carry a high voltage.

One approach to incorporating piezoelectric elements, such as a thin piezoelectric plate, a cylinder or a stack of discs or annuli, into a controllable structure has been described in U.S. Pat. No. 4,849,668 of Javier de Luis and Edward F. Crawley. This technique involves meticulous hand-assembly of various elements into an integral strut in which the piezoceramic elements are insulated and contained within the structure of a laminated composite body which serves as a strong support. The support reduces problems of electrode cracking, and, at least as set forth in that patent, may be implemented in a way calculated to optimize structural strength with mechanical actuation efficiency. Furthermore, for cylinders or stacked annuli the natural internal passage of these off-the-shelf piezo forms simplifies, to some extent, the otherwise difficult task of installing wiring. Nonetheless, design is not simple, and fabrication remains time-consuming and subject to numerous failure modes during assembly and operation.

The field of dynamic testing requires versatile actuators to shake or perturb structures so that their response can be measured or controlled. Here, however, the accepted methodology for shaking test devices involves using an electromechanical motor to create a linear disturbance. The motor is generally applied via a stinger design, in order to decouple the motor from the desired signal. Such external motors still have the drawback that dynamic coupling is often encountered when using the motor to excite the structure. Furthermore, with this type of actuator, inertia is added to the structure, resulting in undesirable dynamics. The structure can become grounded when the exciter is not an integral part of the structure. These factors can greatly complicate device behavior, as well as the modeling or mathematical analysis of the states of interest. The use of piezoelectric actuators could overcome many of these drawbacks, but, as noted above, would introduce its own problems of complex construction, variation in actuation characteristics, and durability. Similar problems arise when a piezoelectric or electrostrictive element is used for sensing.

Thus, improvements are desirable in the manner in which an element is bonded to the structure to be controlled or actuated, such that the element may have high band width actuation capabilities and be easily set up, yet be mechanically and electrically robust, and not significantly alter the mechanical properties of the structure as a whole. It is also desirable to achieve high strain transfer from the piezoelectric element to the structure of interest.

SUMMARY OF THE INVENTION

An actuator assembly according to the present invention includes one or more strain elements, such as a piezoelectric or electrostrictive plate or shell, a housing forming a protective body about the element, and electrical contacts mounted in the housing and connecting to the strain element, these parts together forming a flexible card. At least one side of the assembly includes a thin sheet which is attached to a major face of the En element, and by bonding the outside of the sheet to an object a stiff shear-free coupling is obtained between the object and the strain element in the housing.

In a preferred embodiment, the strain elements are piezoceramic plates, which are quite thin, preferably between slightly under an eighth of a millimeter to several millimeters thick, and which have a relatively large surface area, with one or both of their width and length dimensions being tens or hundreds of times greater than the thickness dimension. A metallized film makes electrode contact, while a bonding agent and insulating material hermetically seal the device against delamination, cracking and environmental exposure. The bonding agent used may be an epoxy, such as B-stage or C-stage epoxy, a thermoplastic, or any other material useful in bonding together the piezoceramic plate, metallized film and insulating material. The specific bonding agent used will depend on the intended application of the device. In a preferred embodiment, the metallized film and insulating material are both provided in a flexible circuit of tough polymer material, which thus provides robust mechanical and electrical coupling to the enclosed elements. Alternatively, the metallized film may be located directly on the piezoceramic plate, and the insulating material may have electrical contacts.

By way of illustration, an example below describes a construction utilizing rectangular PZT plates a quarter millimeter thick, with length and width dimensions each of one to three centimeters, each element thus having an active strain-generating face one to ten square centimeters in area. The PZT plates are mounted on or between sheets of a stiff strong polymer, e.g., one half, one or two mil polymide, which is copper clad on one or both sides and has a suitable conductive electrode pattern formed in the copper layer for contacting the PZT plates. Various spacers surround the plates, and the entire structure is bonded together with a structural polymer into a waterproof, insulated closed package, having a thickness about the same as the plate thickness, e.g., 0.30 to 0.50 millimeters. So enclosed, the package may bend, extend and flex, and undergo sharp impacts, without fracturing the fragile PZT elements which are contained within. Further, because the conductor pattern is firmly attached to the polymide sheet, even cracking of the PZT element does not sever the electrodes, or prevent actuation over the full area of the element, or otherwise significantly degrade its performance.

The thin package forms a complete modular unit, in the form of a small "card", complete with electrodes. The package may then conveniently be attached by bonding one face to a structure so that it couples strain between the enclosed strain element and the structure. This may be done for example, by simply attaching the package with an adhesive to establish a thin, high shear strength, coupling with the PZT plates, while adding minimal mass to the system as a whole. The plates may be actuators, which couple energy into the attached structure, or sensors which respond to strain coupled from the attached structure.

In different embodiments, particular electrode patterns are selectively formed on the sheet to either pole the PZT plates in-plane or cross-plane, and multiple layers of PZT elements may be arranged or stacked in a single card to result in bending or shear, and even specialized torsional actuation.

In accordance with a further aspect of the invention, circuit elements are formed in, or with, the modular package to filter, shunt, or process the signal produced by the PZT elements, to sense the mechanical environment, or even to locally perform switching or power amplification for driving the actuation elements. The actuator package may be formed with pre-shaped PZT elements, such as half-cylinders, into modular surface-mount shells suitable for attaching about a pipe, rod or shaft.

BRIEF DESCRIPTION OR THE DRAWINGS

These and other desirable properties of the invention will be understood from the detailed description of illustrative embodiments, wherein:

FIGS. 5 and 5A show details of the layer structure of the card of FIG. 3;

FIG. 6 shows an actuator package comb electrodes for in-plane actuation;

FIG. 7 illustrates a torsional actuator package using the cards of FIG. 6;

FIG. 9 shows actuators mounted as mechanical elements;

DETAILED DESCRIPTION OF THE INVENTION

Figure 1A:
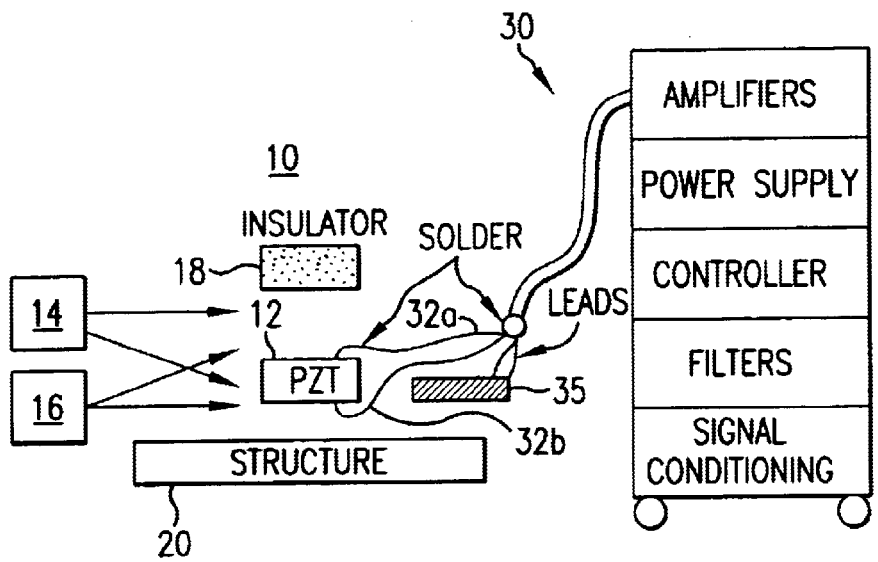
FIG. 1A is a system illustration of a typical prior art actuator.

FIG. 1A illustrates in schema the process and overall arrangement of a prior art surface mounted piezoelectric actuator assembly 10. A structure 20, which may be a structural or machine element, a plate, airfoil or other interactive sheet, or a device or part thereof has a sheet 12 of smart material bonded thereto by some combination of conductive and structural polymers, 14, 16. An insulator 18, which may be formed entirely or in part of the structural polymer 16, encloses and protects the smart material, while conductive leads or surface electrodes are formed or attached by the conductive polymer. An external control system 30 provides drive signals along lines 32a, 32b to the smart material, and may receive measurement signals from surface-mounted instrumentation such as a strain gauge 35, from which it derives appropriate drive signals. Various forms of control are possible. For example, the strain gauge may be positioned to sense the excitation of a natural resonance, and the control system 30 may simply actuate the PZT element in response to a sensor output, so as to stiffen the structure, and thereby shift its resonant frequency. Alternatively, a vibration sensed by the sensor may be fed back as a processed phase-delayed driving signal to null out an evolving dynamic state, or the actuator may be driven for motion control. In better-understood mechanical systems, the controller may be programed to recognize empirical conditions, i.e., aerodynamic states or events, and to select special control laws that specify the gain and phase of a driving signal for each actuator 12 to achieve a desired change.

For all such applications, major work is required to attach the bare PZT plate to its control circuitry and to the workpiece, and many of the assembly steps are subject to failure or, when quantitative control is desired, may require extensive modeling of the device after it has been assembled, in order to establish control parameters for a useful mode of operation that are appropriate for the specific thicknesses and mechanical stiffnesses achieved in the fabrication process.

Figure 1B:
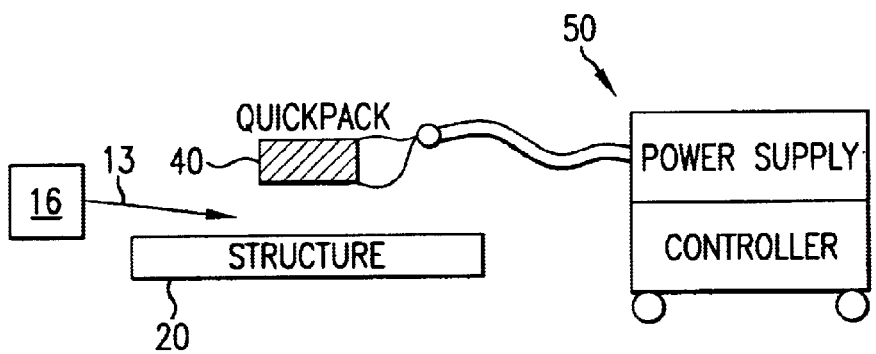
FIGS. 1B and 1C are corresponding illustrations of two systems in accordance with the present invention.

FIG. 1B shows an actuator according to one embodiment of the present invention. As shown, it is a modular pack or card 40 that simply attaches to a structure 20 with a quick setting adhesive, such as a five-minute epoxy 13, or in other configurations attaches at a point or line. The operations of sensing and control thus benefit from a more readily installable and uniformly modeled actuator structure. In particular, the modular pack 40 has the form of a card, a stiff but bendable plate, with one or more electrical connectors preferably in the form of pads located at its edge (not shown) to plug into a multi-pin socket so that it may connect to a simplified control system 50. As discussed in greater detail below with respect to FIG. 2C, the modular package 40 may also incorporate planar or low-profile circuit elements, which may include signal processing elements, such as weighting or shunting resistors, impedance matchers, filters and signal conditioning preamplifiers, and may further include switching transistors and other elements to operate under direct digital control, so that die only external electrical connections necessary are those of a microprocessor or logic controller, and a power supply.

Figure 1C:
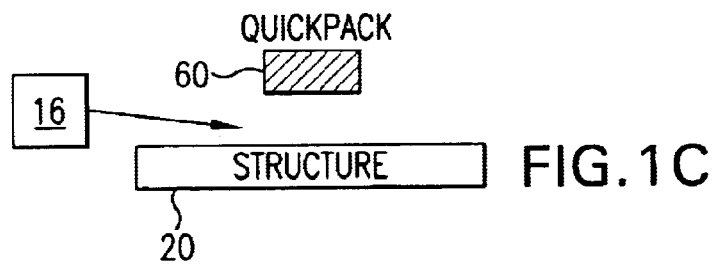

In a further embodiment particularly applicable to some low power control situations, a modular package 60 as shown in FIG. 1C may include its own power source, such as a battery or power cell, and may include a controller, such as a microprocessor chip or programmable logic array, to operate on-board drivers and shunts, thus effecting a complete set of sensing and control operations without any external circuit connections.

The present invention specifically pertains to piezoelectric polymers, and to materials such as sintered metal zirconate, niobate crystal or similar piezoceramic materials that are stiff, yet happen to be quite brittle. It also pertains to electrostrictive materials. As used in the claims below, both piezoelectric and electrostrictive elements, in which the material of the elements has an electromechanical property, will be referred to as electroactive elements. High stiffness is essential for efficiently transferring strain across the surface of the element to an outside structure or workpiece, typically made of metal or a hard structural polymer, and the invention in its actuator aspect does not generally contemplate soft polymer piezoelectric materials. While the terms "stiff" and "soft" are relative, it will be understood that in this context, the stiffness, as applied to an actuator, is approximately that of a metal, cured epoxy, high-tech composite, or other stiff material, with a Young's modulus greater than $0.1 \times 10^6$, and preferably greater than $0.2 \times 10^6$. When constructing sensors, instead of actuators, the invention also contemplates the use of low-stiffness piezoelectric materials, such as polyvinylidene difluoride (PVDF) film and the substitution of lower cure temperature bonding or adhesive materials. The principal construction challenges, however, arise with the first class of piezo material noted above, and these will now be described.

In general, the invention includes novel forms of actuators and methods of making such actuators, where "actuator" is understood to mean a complete and mechanically useful device which, when powered, couples force, motion or the like to an object or structure. In its broad form, the making of an actuator involves "packaging" a raw electro-wave element to make it mechanically useful. By way of example, raw electro-active piezoelectric materials or "elements" are commonly available in a variety of semi-processed bulk material forms, including raw piezoelectric material in basic shapes, such as sheets, rings, washers, cylinders and plates, as well as more complex or composite forms, such as stacks, or hybrid forms that include a bulk material with a mechanical element, such as a lever. These materials or raw elements may have metal coated on one or more surfaces to act as electrical contacts, or may be non-metallized. In the discussion below, piezoelectric materials shall be discussed by way of example, and all these forms of raw materials shall be referred to as "elements", "materials", or "electro-active elements". As noted above, the invention further includes structures or devices made by these methods and operating as transducers to sense, rather than actuate, a strain, vibration, position or other physical characteristic, so that where applicable below, the term "actuator" may include sensing transducers.

Embodiments of the invention employ these stiff electrically-actuated materials in thin sheets—discs, annuli, plates and cylinders or shells—that are below several millimeters in thickness, and illustratively about one fifth to one quarter millimeter thick. Advantageously, this thin dimension allows the achievement of high electric field strengths across a distance comparable to the thickness dimension of the plate at a relatively low overall potential difference, so that full scale piezoelectric actuation may be obtained with driving voltages of ten to fifty volts, or less. Such a thin dimension also allows the element to be attached to an object without greatly changing the structural or physical response characteristics of the object. However, in the prior art, such thin elements are fragile, and may break due to irregular stresses when handled, assembled or cured. The impact from falling even a few centimeters may fracture a piezoceramic plate, and only extremely small bending deflections are tolerated before breaking.

In accordance with the present invention, the thin electrically actuated element is encased by layers of stiff insulating material, at least one of which is a tough film which has patterned conductors on one of its surfaces, and is thinner than the element itself. A package is assembled from the piezo elements, insulating layers, and various spacers or structural fill material, such that altogether the electrodes, piezo element(s), and enclosing films or layers form a sealed card of a thickness not substantially greater than that of the bare actuating element. Where elements are placed in several layers, as will be described below, the package thickness is not appreciably greater than the sum of the thicknesses of the stacked actuating elements.

Figure 2A:
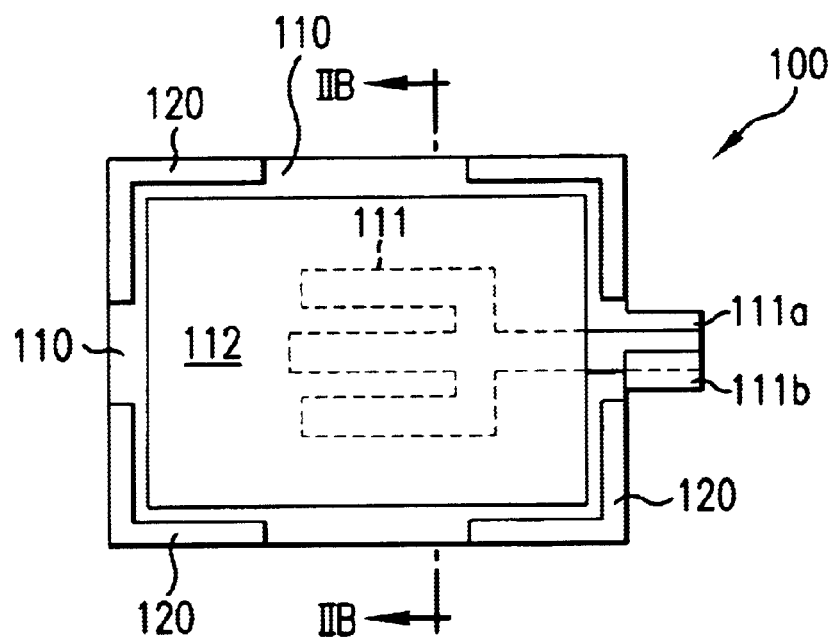
FIGS. 2A and 2B show top and cross-sectional views, respectively, of a basic actuator or sensor card in accordance with the present invention.

FIG. 2A illustrates a basic embodiment 100 of the invention. A thin film 110 of a highly insulating material, such as a polyimide material, is metallized, typically copper clad, on at least one side, and forms a rectangle which is coextensive with or slightly larger than the finished actuator package. A suitable material available for use in fabricating multilayer circuit boards is distributed by the Rogers Corporation of Chandler, Ariz. as their Flex-I-Mid 3000 adhesiveless circuit material, and consists of a polymide film formed on a rolled copper foil. A range of sizes are available commercially, with the metal foils being of 18 to 70 micrometer thickness, integrally coated with a polymide film of 13 to 50 micrometer thickness. Other thicknesses may be fabricated. In this commercial material, the foil and polymer film are directly attached without adhesives, so the metal layer may be patterned by conventional masking and etching, and multiple patterned layers may be built up into a multilayer board in a manner described more fully below, without residual adhesive weakening the assembly or causing delamination. The rolled copper foil provides high in-plane tensile strength, while the polymide film presents a strong, tough and defect-free electrically insulating barrier.

In constructions described below, the film constitutes not only an insulator over the electrodes, but also an outer surface of the device. It is therefore required to have high dielectric strength, high shear strength, water resistance and an ability to bond to other surfaces. High thermal resistance is necessary in view of the temperature cure used in the preferred fabrication process, and is also required for some application environments. In general, polyamide/imides have been found useful, but other materials, such as polyesters or thermoplastics with similar properties, may also be used.

In the present constructions, the foil layer is patterned by conventional masking and etch techniques (for example, photoresist masking and patterning, followed by a ferric chloride etch), to form electrodes for contacting the surface of piezo plate elements. Alternatively, a more ductile, thin conductive layer may be used. For example, a thin conductive layer may be printed on the polymer film or directly on the piezoelectric element using silver conductive ink. In FIG. 2A, electrodes 111 extend over one or more sub-regions of the interior of the rectangle, and lead to reinforced pads or lands 111a, 111b extending at the edge of the device. The electrodes are arranged in a pattern to contact a piezoelectric element along a broadly-turning path, which crosses the full length and width of the element, and thus assures that the element remains connected despite the occurrence of a few cracks or local breaks in the electrode or the piezo element. Frame members 120 are positioned about the perimeter of sheet 110, and at least one piezoelectric plate element 112 is situated in the central region so that it is contacted by the electrodes 111. The frame members serve as edge binding, so that the thin laminations do not extend to the edge, and they also function as thickness spacers for the hot-press assembly operation described further below, and as position-markers which define the location of piezo plates that are inserted during the initial stages of assembling the laminated package.

FIG. 2A is a somewhat schematic view, inasmuch as it does not show the layer structure of the device which secures it together, including a further semi-transparent top layer 116 (FIG. 2B), which in practice extends over the plate 112 and together with the spacers 120 and sheet 110 closes the assembly. A similar layer 114 is placed under the piezo element, with suitable cut-outs to allow the electrodes 111 to contact the element. Layers 114, 116 are preferably formed of a curable epoxy sheet material, which has a cured thickness equal to the thickness of the metal electrode layer, and which acts as an adhesive layer to join together the material contacting it on each side. When cured, this epoxy constitutes the structural body of the device, and stiffens the assembly, extending entirely over a substantial portion of the surface of the piezo element to strengthen the element and arrest crack growth, thereby enhancing its longevity. Furthermore, epoxy from this layer actually spreads in a microscopically thin but highly discontinuous film, about 0.0025 mm thick, over the electrodes, bonding them firmly to the piezo plate, but with a sufficient number of voids and pinholes so that direct electrical contact between the electrodes and piezo elements still occurs over a substantial and distributed contact area.

Figure 2B:
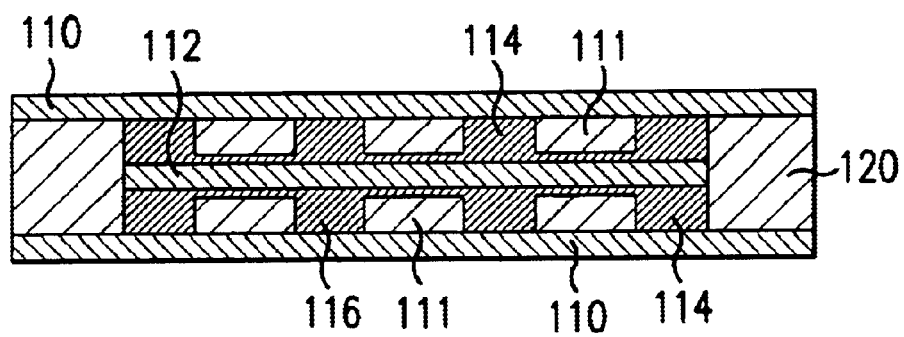

FIG. 2B shows a cross-sectional view, not drawn to scale, of the embodiment of FIG. 2A. By way of rough proportions, taking the piezoelectric plate 112 as 0.2–0.25 millimeters in thickness, the insulating film 110 is much thinner, no more than one-tenth to one-fifth the plate thickness, and the conductive copper electrode layer 11 may have a thickness typically of ten to fifty microns, although the latter range is not a set of strict limits, but represents a useful range of electrode thicknesses that are electrically serviceable, convenient to manufacture and not so thick as to either impair the efficiency of strain transfer or introduce problems. The structural epoxy 114 fills the spaces between electrodes 111 in each layer, and has approximately the same thickness as those electrodes, so that the entire assembly forms a solid block. The spacers 120 are formed of a relatively compressible material, having a low modulus of elasticity, such as a relatively uncrosslinked polymer, and, when used with a pressure-cured epoxy as described below, are preferably of a thickness roughly equivalent to the piezoceramic plate or stack of elements, so that they form an edge binding about the other components between the top and bottom layers of film 110.

A preferred method of manufacture involves applying pressure to the entire package as the layer 116 cures. The spacers 120 serve to align the piezoceramic plates and any circuit elements, as described below with reference to FIGS. 3–5, and they form a frame that is compressed slightly during assembly in the cure step, at which time it may deform to seal the edges without leaving any stress or irregularities. Compression eliminates voids and provides a dense and crack-free solid medium, while the curing heat effects a high degree of cross-linking, resulting in high strength and stiffness.

An assembly process for the embodiment of FIGS. 2A, 2B is as follows. One or more pieces of copper clad polyimide film, each approximately 0.025 to 0.050 millimeters thick in total, are cut to a size slightly larger than the ultimate actuator package dimensions. The copper side of the film is masked and patterned to form the desired shape of electrodes for contacting a piezo element together with conductive leads and any desired lands or access terminals. A pitchfork electrode pattern is shown, having three times which are positioned to contact the center and both sides of one face of a piezo element, but in other embodiments an H- or a comb-shape is used. The patterning may be done by masking, etching and then cleaning, as is familiar from circuit board or semiconductor processing technology. The masking is effected by photoresist patterning, screening, tape masking, or other suitable process. Each of these electroded pieces of polyimide film, like a classical printed circuit board, defines the positions of circuit elements or actuator sheets, and will be referred to below simply as a "flex circuit." However, methods and devices of the invention also contemplate using an electroded piezo element, an insulator, and electrical contacts, rather than a "flex circuit".

Next, uncured sheet epoxy material having approximately the same thickness or slightly thicker than the electrode foil layer is cut, optionally with through-apertures matching the electrode pattern to allow enhanced electrical contact when assembled, and is placed over each flex circuit, so it adheres to the flex circuit and forms a planarizing layer between and around the electroded portions. The backing is then removed from the epoxy layers attached to the flex circuits, and pre-cut spacers 120 are placed in position at corner and edges of the flex circuit The spacers outline a frame which extends above the plane of the electrodes, and defines one or more recesses into which the piezo elements are to be fitted in subsequent assembly steps. The piezo element or elements are then placed in the recesses defined by the spacers, and a second electroded film 111, 112 with its own planarizing/bonding layer 114 is placed over the element in a position to form electrode contacts for the top of the piezo element. If the device is to have several layers of piezo elements, as would be the case for some bending actuator constructions, these assembly steps are repeated for each additional electroded film and piezoelectric plate, bearing in mind that a polymide film which is clad and patterned on both sides may be used when forming an intermediate electrode layer, that is to contact actuator elements both above and below the intermediate sheet.

Once all elements are in place, the completed sandwich assembly of patterned flex circuits, piezo sheets, spacers and curable patterned epoxy layers is placed in a press between heated platens, and is cured at an elevated temperature and pressure to harden the assembly into a stiff, crack-free actuator card. In a representative embodiment, a cure cycle of thirty minutes at 350° F. and 50–100 psi pressure is used. The epoxy is selected to have a curing temperature below the depoling temperature of the piezo elements, yet achieve a high degree of stiffness.

The above construction illustrates a simple actuator card having a single piezo plate sandwiched between two electroded films, so that the plate transfers shear strain efficiently through a thin film to the surface of the actuator card. The measure of transfer efficiency, given by the shear modulus divided by layer thickness squared, and referred to as gamma ($\Gamma$), depends on the moduli and thickness of the epoxy 114, the rolled foil electrodes 111, and the polyimide film 110. In a representative embodiment in which the epoxy and copper electrode layers are 1.4 mils thick and the epoxy has a modulus of $0.5 \times 10^6$, a gamma of approximately $9 \times 10^{10}$ pounds/inch$^4$ is achieved. Using a thinner epoxy layer and film with 0.8 mil foil, substantially higher $\Gamma$ is achieved. In general, the gamma of the electrode/epoxy layer is greater than $5 \times 10^{10}$ pounds/inch$^4$, while that of the film is greater than $2 \times 10^{10}$ pounds/inch$^4$.

It should be noted that using PZT actuator plates ten mils thick, a card having two PZT plates stacked over each other with three flex circuit electroded film layers (the middle one being double clad to contact both plates) has a total thickness of 28 mils, only forty percent greater than the plates alone. In terms of mass loading, the weight of the actuator elements represents 90% of the total weight of this assembly. Generally, the plates occupy fifty to seventy percent of the package thickness, and constitute seventy to ninety percent of its mass, in other constructions. Thus, the actuator itself allows near-theoretical performance modeling. This construction offers a high degree of versatility as well, for implementing benders (as just described) as well as stacks or arrays of single sheets.

Another useful performance index of the actuator constructed in accordance with the present invention is the high ratio of actuator strain c to the fee piezo element stain $\Lambda$, which is approximately (0.8) for the two layer embodiment described herein, and in general is greater than (0.5). Similarly, the ratio of package to free element curvatures, K, is approximately 0.85–0.90 for the described constructions, and in general is greater than 0.7.

Thus, overall, the packaging involved in constructing a piezo element embedded in a flex circuit impairs its weight and electromechanical operating characteristics by well under 50%, and as little as 10%, while profoundly enhancing its hardiness and mechanical operating range in other important respects. For example, while the addition of sheet packaging structure to the base element would appear to decrease attainable K, in practical use the flex card construction results in piezo bender constructions wherein much greater total deflection may be achieved, since large plate structures may be fabricated and high curvature may be repeatedly actuated, without crack failure or other mechanical failure modes arising. Several Figures will illustrate the variety of constructions to which such enhanced physical characteristics are brought.

Figure 2C:
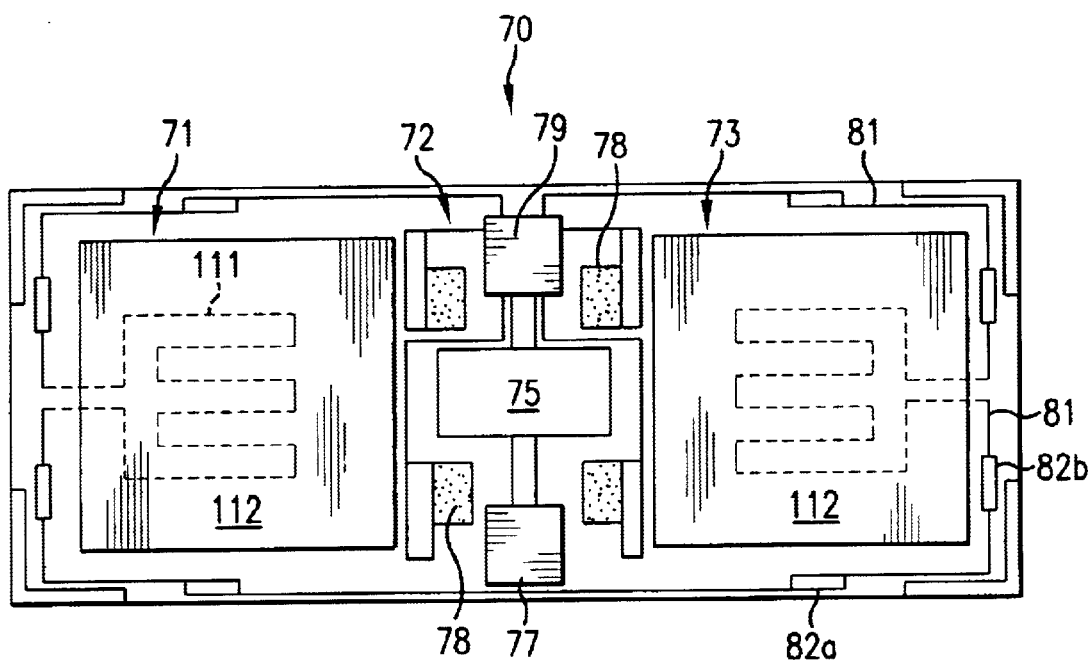
FIG. 2C illustrates an actuator or sensor card with circuit elements.

First, the structure of an electroactive element embedded between flex circuits not only provides a low mass unified mechanical structure with predictable response characteristics, but also allows the incorporation of circuit elements into or onto the actuator card. FIG. 2C shows a top view of one device 70 of this type, wherein regions 71, 73 each contain broad electro-active sheets, while a central region 72 contains circuit or power elements, including a battery 75, a planar power amplification or set of amplifiers 77, a microprocessor 79, and a plurality of strain gauges 78. Other circuit elements 82*a*, 82*b* may be located elsewhere along the path of circuit conductors 81 about the periphery. As with the other embodiments, spacers 120 define layout and seal edges of the device, while electrodes 111 attach the electroactive elements to the processing or control circuitry which is now built-in. The circuit elements 82*a*, 82*b* may comprise weighting resistors if the device is operated as a sensor, or shunting resistors to implement passive damping control. Alternatively, they may be filtering, amplifying, impedance matching or storage elements, such as capacitors, amplifiers or the like. In any case, these elements also are located away from electro-active plates 84. The components collectively may sense strain and implement various patterns of actuation in response to sensed conditions, or perform other sensing or control tasks.

Figure 3:
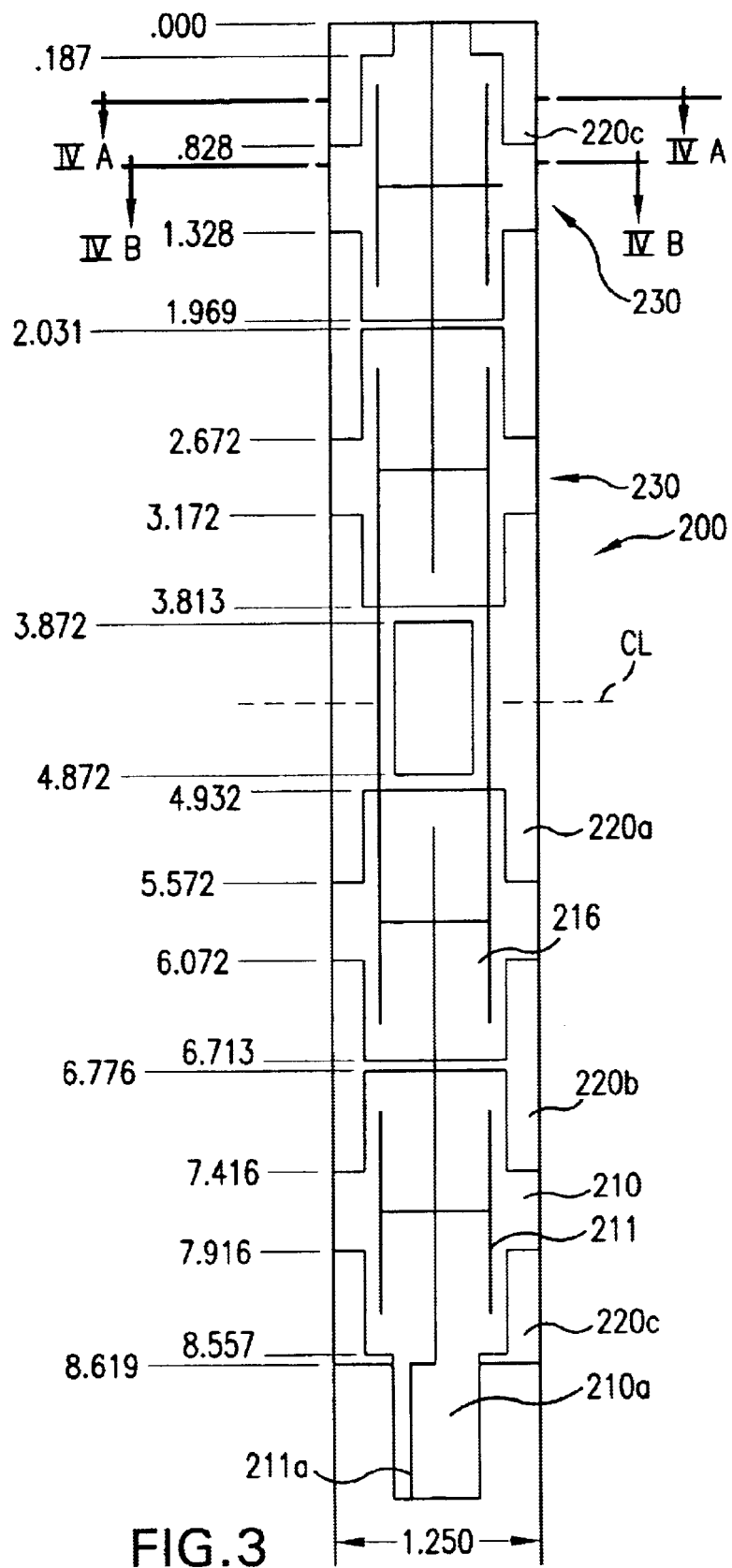
FIG. 3 illustrates another card.

Returning now to the actuator aspect of the invention, FIG. 3 shows a top view of an actuator package 200 having dimensions of about 1.25×9.00×0.030 inches and assembled with two layers of piezoelectric plates of four plates each. A rectangular polyimide sheet 210 with an end tab 210*a* carries an electrode 211 in the form of a lattice of H-shaped thin copper lines interconnected to each other and to a single runner 211*a* that leads out to the tab, thus providing a low impedance connection directly to each of four rectangular regions which hold the piezo plates.

Spacer elements 220*a*, 220*b* of H-shape, or 220*c* of L-shape mark off corners and delineate the rectangular spaces for location of the piezo plates 216. In this embodiment, a plurality of gaps 230, discussed further below, appear between adjacent the H- or L-spacers. As will be apparent from the description below, the use of these small discrete spacer elements (I-, T- or O-shaped spacers may also be convenient) is enhanced because they may be readily placed on the tacky bonding epoxy layer 114 during assembly to mark out assembly positions and form a receiving recess for the piezo elements. However, the spacer structure is not limited to such a collection of discrete elements, but may be a single or couple of frame pieces, formed as a punched-out sheet or molded frame, to provide all, or one or more, orienting and/or sealing edges, or recesses for holding actuation of circuit components.

FIG. 5 illustrates a top view of each of the three sheet, electrode and piezo plate layers separately, while FIG. 5A illustrates the general layering sequence of the film, conductor, and spacer/piezo layers. As shown, the spacers 220 and piezo plates 216 constitute a single layer between each pair of electrode layers.

Figure 4B:
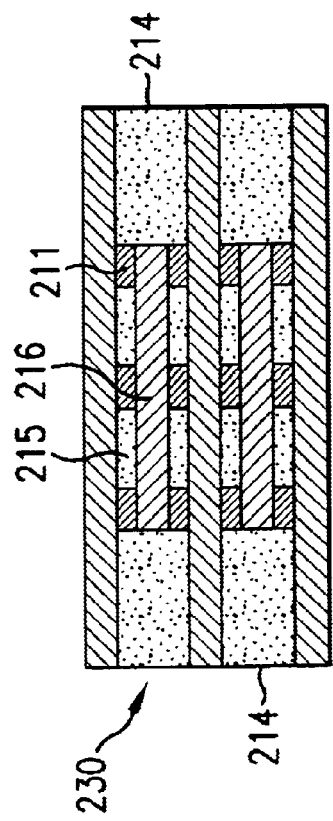
FIGS. 4A and 4B show sections through the card of FIG. 3.
Figure 4A:
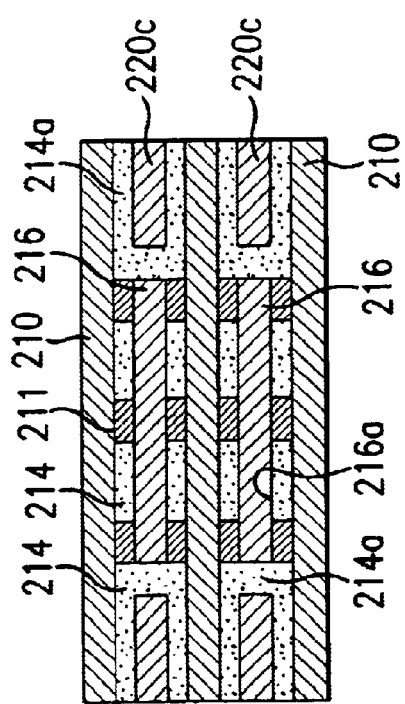

FIGS. 4A and 4B (not drawn to scale) illustrate the layer structure of the assembled actuator along the vertical sections at the positions indicated by "A" and "B" in FIG. 3. As more clearly shown in FIG. 4A, a patterned bonding layer of epoxy sheet 214 is coplanar with each electrode layer 211 and fills the space between electrodes, while the spacer 220*c* is coplanar with the piezo plate 216 and substantially the same thickness as the plate or slightly thicker. Illustratively, the piezo plate 216 is a PZT-5A ceramic plate, available commercially in a five to twenty mil thickness, and has a continuous conductive layer 216*a* covering each face for contacting the electrodes 211. The spacers 220 are formed of somewhat compressible plastic with a softening temperature of about 250° C. This allows a fair degree of conformability at the cure temperature so the spacer material may fill slight voids 214*a* (FIG. 4A) during the assembly process. As shown in FIG. 4B, the gaps 230 (when provided) between spacers result in openings 214*b* which vent excess epoxy from the curable bonding layers 214, and fill with epoxy during the cure process. As illustrated in that FIGURE, a certain amount of epoxy also bleeds over into patches of film 215 between the electrodes 211 and the piezo plate 216. Because of the large and continuous extent of electrode 211, this patchy leakage of epoxy does not impair the electrical contact with the piezo elements, and the additional structural connection it provides helps prevent electrode delamination.

It will be appreciated that with the illustrated arrangements of electrodes, each vertically stacked pair of piezo plates may be actuated in opposition to each other to induce bending, or more numerous separate electrodes may be provided to allow different pairs of plates to be actuated in different ways. In general, as noted above, the invention contemplates even quite complex systems involving many separate elements actuated in different ways, with sensing, control, and power or damping elements all mounted on the same card. In this regard, great flexibility in adapting the card to practical tasks is further provided by its flexibility. In general, it has a supple flexibility comparable to that of an epoxy strip thirty mils thick, so that it may be bent, struck or vibrated without damage. It may also be sharply bent or curved in the region of its center line CL (FIG. 3) where no piezo elements are encased, to conform to an attaching surface or corner. The elements may be poled to change dimension in-plane or cross-plane, and the actuators may therefore be attached to transmit strain to an adjacent surface in a manner effective to perform any of the above-described control actions, or to launch particular waveforms or types of acoustic energy, such as flexural, shear or compressional waves into an adjacent surface.

Figure 11A:
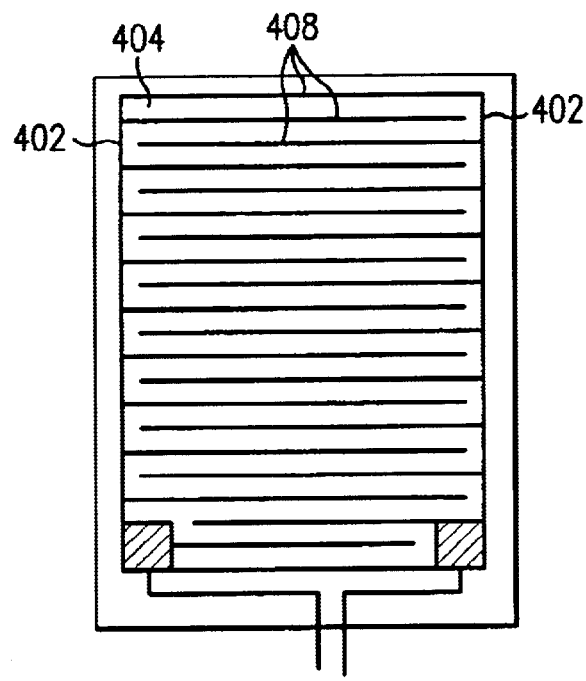
FIG. 11A shows a line interdigitally electroded electro-active device having the common buses located on a piezoelectric element.
Figure 11B:
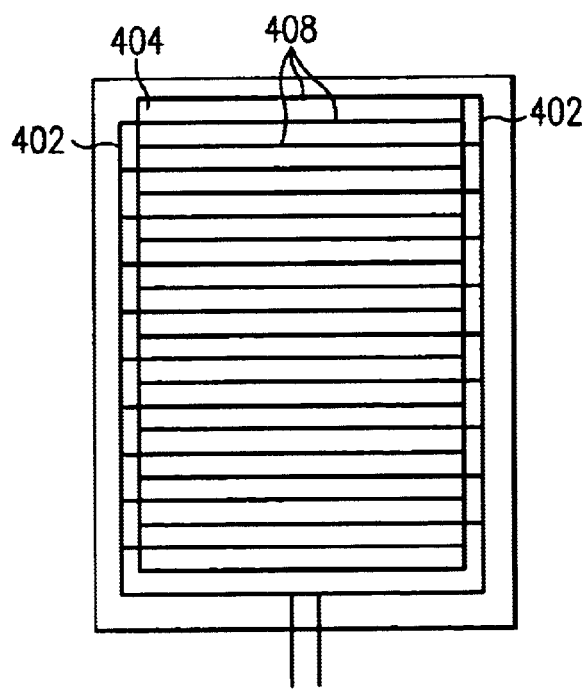
FIG. 11B shows a line interdigitally electroded electro-active device having the common buses located beyond the piezoelectric element.
Figure 12:
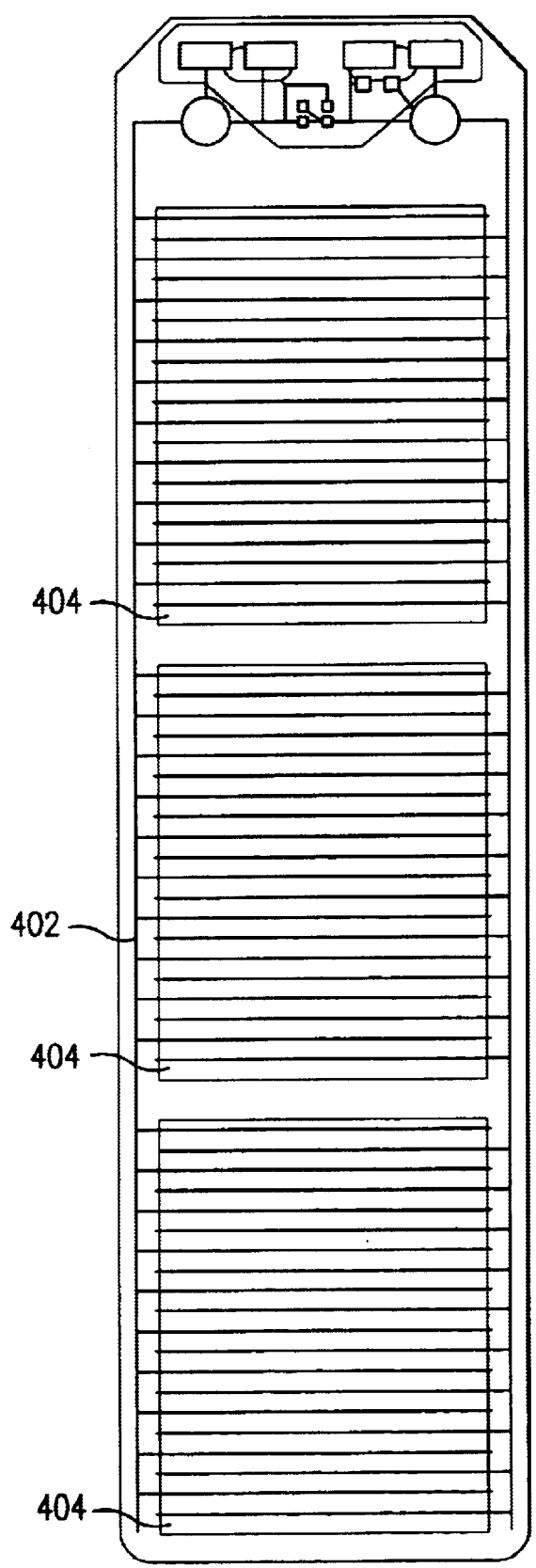
FIG. 12 shows a non-angled line interdigitally electroded electro-active device having multiple piezoelectric elements.

FIG. 6 shows another actuator embodiment 300. In this embodiment, illustrated schematically, the epoxy bonding layer, film and spacer elements are not shown, but only electrode and piezo sheets are illustrated to convey the operative mechanisms. A first set of electrodes 340 and second set 342 are both provided in the same layer, each having the shape of a comb with the two combs interdigitated so that an electrical actuation field is set up between the tooth of one comb and an adjacent tooth of the other comb. As shown in FIGS. 11A and 11B, the line electrodes 408 (i.e., the "teeth" of the comb configuration) connect to a common bus 402. The bus 402 may be located on (shown in FIG. 11A) or off (shown in FIG. 11B) of the piezoceramic surface 404. FIG. 12 also shows an embodiment of the invention 400 in which the bus 402 is located off of the piezoceramic surface 404. Alternatively, the bus may be located on the opposite side of the polymer film of the flex circuit. The line electrodes make electrical connection with the bus though the polymer film. For example, the polymer film may comprise appropriately located plated throughholes, or may simply be abraded away to gain electrical contact. The interlocking "comb teeth" configuration of electrodes, as shown in FIGS. 11A, 11B, and 12, for example, is referred to herein as interdigital electrodes (IDE). In FIG. 6, a parallel pair of combs 340*a*, 342*a* is provided on the other side of the piezo sheet, with comb electrode 340 tied to 340*a*, and comb electrode 342 tied to 342*a*, so as to set up an electric field with equipotential Lines "e" extending through the piezo sheet, and in-plane potential gradient between each pair of teeth from different combs. In the embodiment shown, the piezoceramic plates are not metallized, so direct electrical contact is made between each comb and the plate. The plates are poled in-plane, by initially applying a high voltage across the combs to create a field strength above one two thousand volts per inch directed along the in-plane direction. This orients the piezo structure so that subsequent application of a potential difference across the two-comb electrodes results in in-plane (shear) actuation. Thus, the direct contact of interdigital electrodes provides to the piezo element an electrical field which is generally parallel to the actuation direction.

Figure 10C:
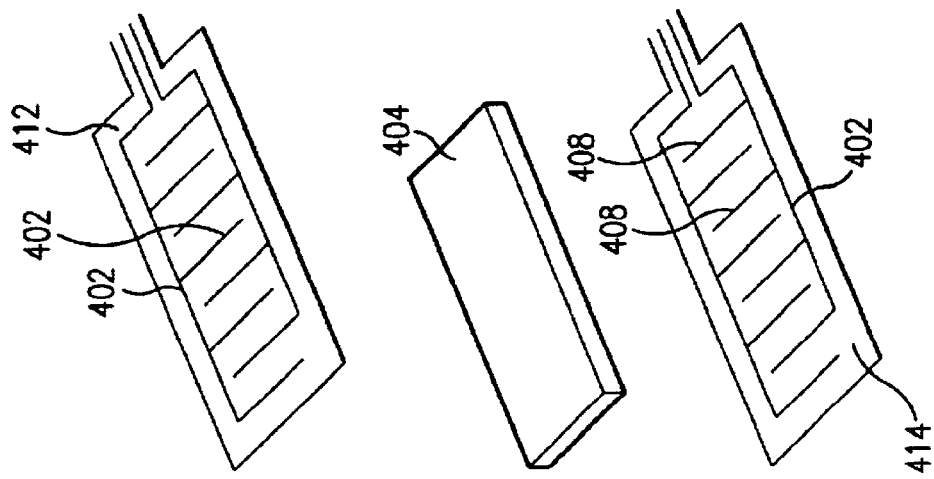
FIGS. 10A, 10B and 10C show different constructions of line interdigitally electroded electro-active device.
Figure 10B:
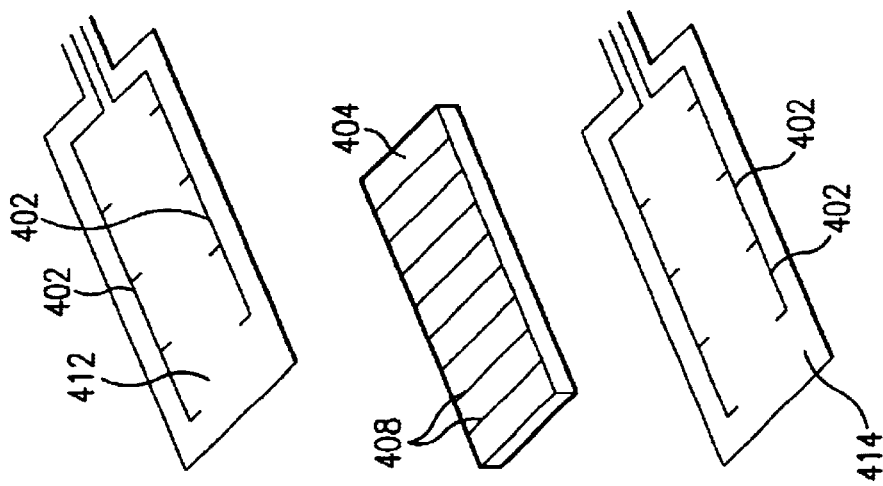
Figure 10A:
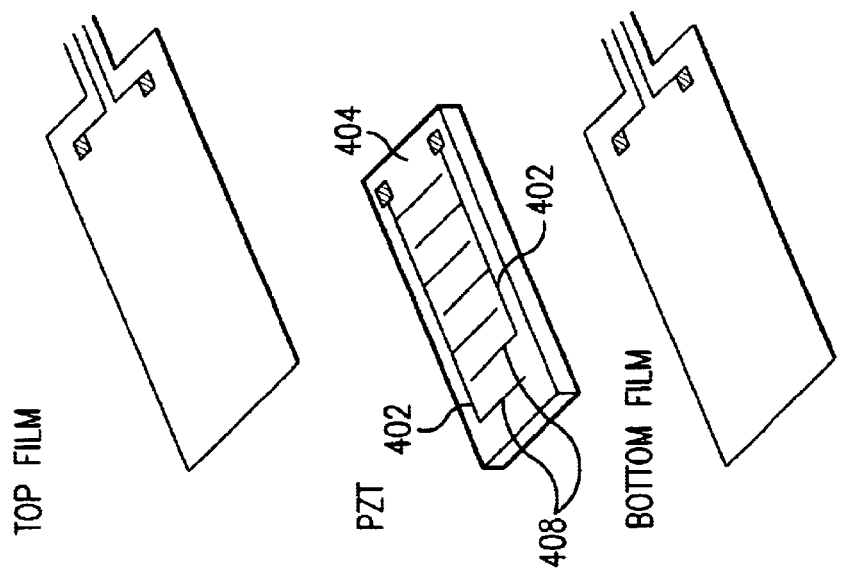

FIGS. 10A, 10B, and 10C show various configurations of embodiments of the invention. FIG. 10A shows an IDE pattern, including the line electrodes 408 and the common buses 402, printed directly on the PZT element 404. FIG. 10B shows line electrodes 408 printed on the PZT element

404, and common buses printed on both the top and bottom films, 412 and 414. FIG. 10C shows an IDE pattern, including the line electrodes 409 and the common buses 402 on both the top and bottom films, 412 and 414.

Figure 13:
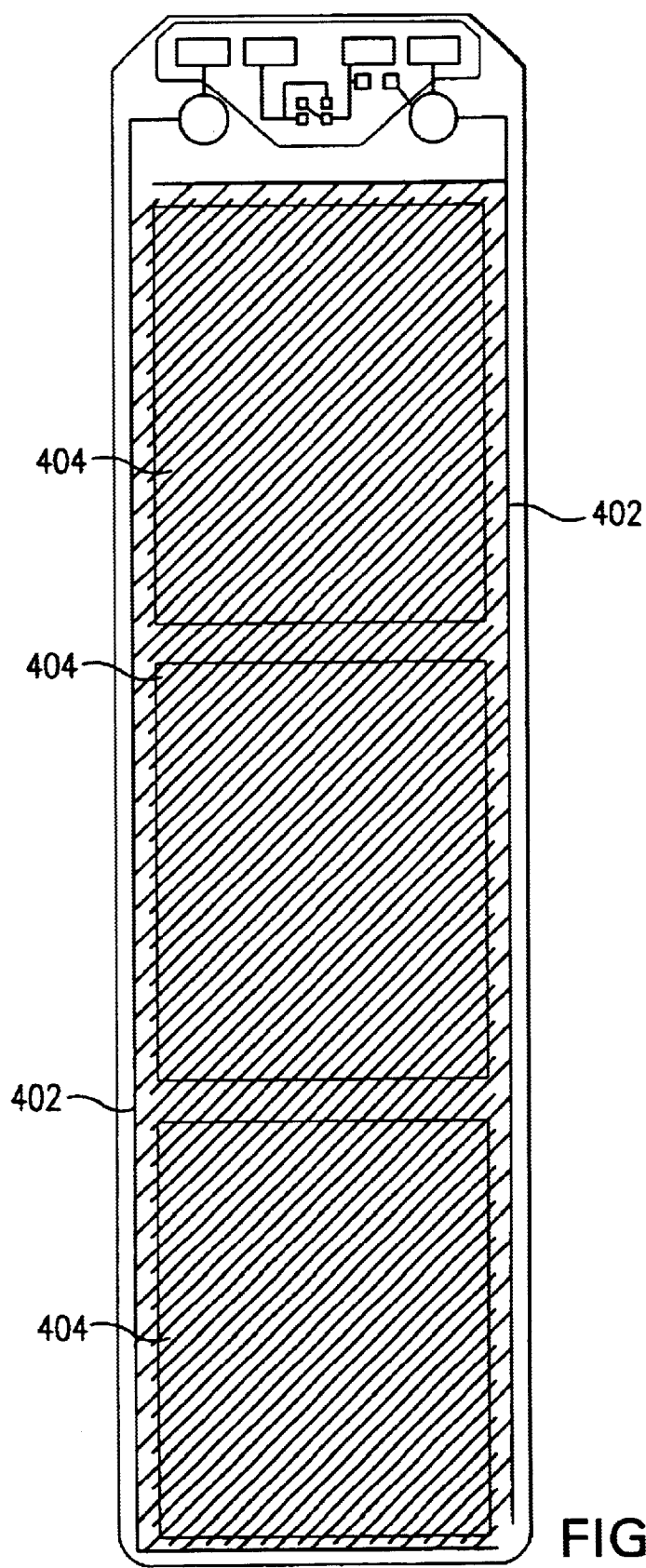
FIG. 13 shows an angled line interdigitally electrode electro-active device having multiple piezoelectric elements.
Figure 14A:
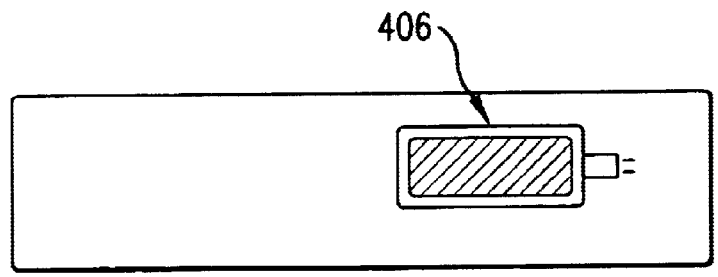
FIG. 14A show an angled line interdigitally electroded electro-active device bonded to a beam structure.
Figure 14B:
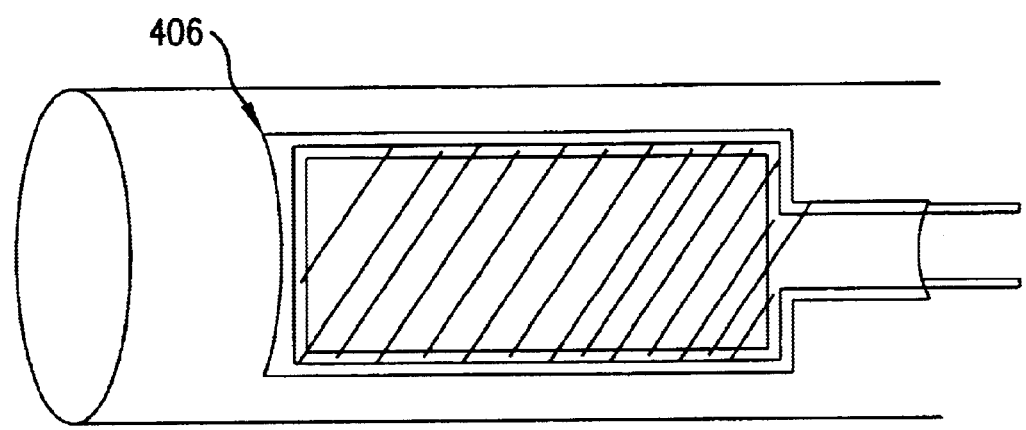
FIG. 14B shows an angled line interdigitally electroded electro-active device bonded to a tube or rod structure.

In addition to shear actuation, directional actuation and damping may be effected using methods or devices of the invention. For example, as shown in FIG. 7, two such actuators 300 may be crossed to provide torsional actuation. Alternatively, as shown in FIGS. 13, 14A and 14B, an angled IDE patterned actuator 406 may be positioned on a structure along the principle strain axis of the structure to couple shear torsion energy. The same effect may be achieved by bonding a piezo device having a non-angled IDE pattern on a structure such that the IDE pattern is effectively at an angle with the principle stain axis of the piezo element, i,e., the device is bonded at an angle.

Figure 8B:
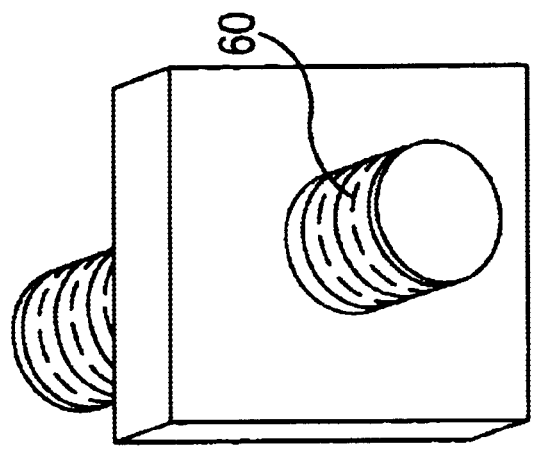
FIGS. 8A and 8B show actuators mounted as surface mount actuators on a surface or rod, respectively.
Figure 8A:
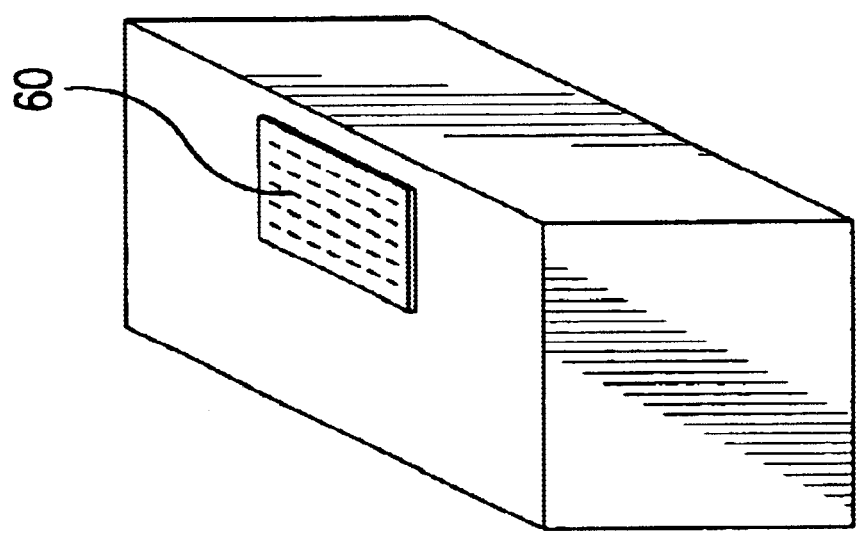

In discussing the embodiments above, the direct transfer of strain energy through the electrode/polyimide layer to any adjoining structure has been identified as a distinct and novel advantage. Such operation may be useful for actuation tasks or diverse as airfoil shape control actuation and noise or vibration cancellation or control. FIGS. 8A and 8B illustrates typical installations of flat (FIG. 8A) and hemicylindrical (FIG. 8B) embodiments 60 of the actuator, applied to a flat or slightly curved surface, and a shaft, respectively.

However, while the electromechanical materials of these actuators operate by strain energy conversion, applications of the present invention extend beyond strain-coupling through the actuator surface, and include numerous specialized mechanical constructions in which the motion, torque or force applied by the actuator as a whole is utilized. In each of these embodiments, the basic strip or shell-shaped sealed actuator is employed as a robust, springy mechanical element, pinned or connected at one or more points along its lenhgh. As shown in FIG. 9, when electrically actuated, the strip then functions, alone or with other elements, as a self-moving lever, flap, leaf spring, stack or bellows. In the diagrams of FIGS. 9(a)–9(q), the elements A, A', A" . . . are strip or sheet actuators such as shown in the above FIGURES, while small triangles indicate fixed or pinned positions which correspond, for example, to rigid mounting points or points of connection to a structure. Arrows indicate a direction of movement or actuation or the contact point for such actuation, while L indicates a lever attached to the actuator and S indicates a stack element or actuator.

The configurations of FIGS. 9(a)9(c) as stacks, benders, or pinned benders may replace many conventional actuators. For example, a cantilevered beam may carry a stylus to provide highly controlled single-axis displacement to constitute a highly linear, large displacement positioning mechanism of a pen plotter. Especially interesting mechanical properties and actuation characteristics are expected firm multi-element configurations 9(d) et seq., which capitalize on the actuators having a sheet extent and being mechanically robust. Thus, as shown in FIGS. 9(d) and (e), a pin-pin bellows configuration may be useful for extended and precise one-axis Z-movement positioning, by simple face-contacting movement, for applications such as camera focusing; or may be useful for implementing a peristalsis-type pump by utilizing the movement of the entire face bearing against a fluid. As noted in connection with FIG. 3, the flex circuit is highly compliant, so hinged or folded edges may be implemented by simply folding along positions such as the centerline in FIG. 3, allowing a closed bellows assembly to be made with small number of large, multi-element actuator units. The flex circuit construction allows strips or checkerboards of actuator elements to be laid out with fold lines between each adjacent pair of elements, and the fold lines may be impressed with a thin profile by using a contoured (e.g. waffle-iron) press platen during the cure stage. With such a construction, an entire seamless bellows or other folded actuator may be made from a single flex circuit assembly.

Figure 16:
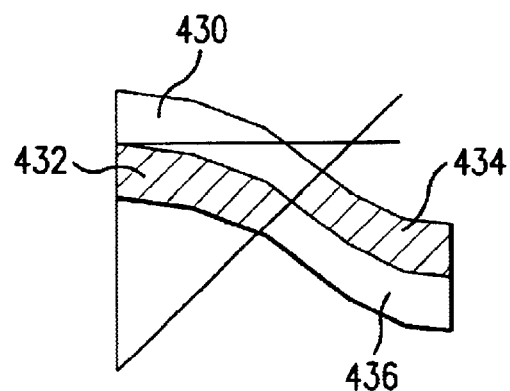
FIG. 16 shows an S-shaped device having electro-active quadrants.
Figure 17:
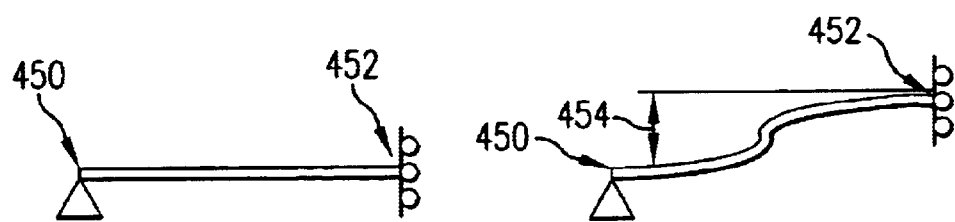
FIG. 17 shows relative displacement of an S-shaped device.

FIG. 16 shows an embodiment of an S-shaped device that has four piezoelectric regions 430, 432, 434, and 436. In such an embodiment, the device has a generally sigmoidal shape. In the embodiment shown in FIG. 16, the device has two portions that have curvatures in opposite directions. For example, one portion of the device may display a curvature (430 and 432) that is positive relative to a reference, while a second portion of the device may display a curvature (434 and 436) that is negative relative to the reference. Although the two portions of an S-shaped device may be substantially equal in length, size, and in the degree of curvature, useful devices also include those comprising two or more portions of unequal length, size, and/or degree of curvature. As shown in FIG. 17, in an S-shaped device, one end of the device (452) is displaced some distance (454) relative to a second end of the device (450). This type of displacement is achieved by driving the piezoelectric elements in regions 432 and 434 in one direction relative to their poling fields (positive or negative), and the piezoelectric elements in regions 430 and 436 in an opposite direction relative to their poling fields. Any arrangement of poling direction and field direction is permitted, provided that the arrangement results in a device having a generally sigmoidal shape. Referring to FIG. 16, the field may be driven from the outer electrodes of quadrants 430 and 434 to the outer electrodes of quadrants 432 and 436 with no contact to the center. Alternatively, the field can be driven from the outer electrode of each quadrant to the inner electrode of each quadrant, allowing independent access to each piezoelectric element. The latter configuration allows the device to be S-shaped or a traditional bimorph depending on the driving conditions. Embodiments of the invention include devices in which the separate piezoelectric elements, or separately poled regions of the device, are in electrical contact with separate electrodes, as well as devices in which two or more regions are in electrical contact with electrodes that are in electrical communication with each other.

Although FIG. 16 shows a bimorph S-shaped device, an S-shaped device may be unimorph, bimorph, or multimorph in design. The regions (430, 432, 434, and 436) may represent separate piezoelectric elements, or separately poled regions of a piezoelectric element, or a combination of separate piezoelectric elements and separately poled regions of a piezoelectric element. For example, in an embodiment of a unimorph device, quadrants 430 and 434 may be two separate piezoelectric elements driven such that one has positive curvature while the other has negative curvature, and regions 432 and 436 may be inactive. An inactive region may comprise metal, such as brass or stainless steel, plastic, polyimide, polyester, some other polymer, wood, or a composite such as fiberglass, graphite, or GRFP. Alternatively, an inactive region may comprise a component of larger system, i.e., through physical bonding or other integration. For example, an inactive region may comprise a beam or plate of a panel used for acoustic emission metal, or a suspension structure in a disk drive suspension (such as would be useful when it would be desirable to translate or displace the suspension head, but minimize the rotation of the suspension head).

In another embodiment, an S-shaped device may comprise two piezoelectric elements. Each piezoelectric element may comprise two electroded regions that are poled in opposite directions and driven with a field in the same direction relative to the thickness of the elements. Alternatively, the electroded regions may be poled in the same direction and driven with a field in the opposite directions relative to the thickness of the elements.

Embodiments of the invention include both a packaged S-shaped device, as well as S-shaped actuators which have not been packaged as a card.

Actuators of the invention can be utilized to perform simple mechanical motions, such as bending, twisting or wiggling, applied to portions of a face mask or puppet for theatrical animation, and has found the actuators to have excellent actuation characteristics and versatile mounting possibilities for small-load, medium displacement actuation tasks of this type.

In general, tasks capable of implementation with pneumatic actuators of small or medium displacement may be addressed using the flex circuit actuator cards of the invention as discrete mechanical elements, and where the task involves a structure such as a sheet, flap or wall, the flex circuit itself may constitute that structural component. Thus, the invention is suited to such functions as self-moving stirring vanes, bellows or pump walls, mirrors, and the like. In addition, as noted above, tasks involving surface coupling of small displacement acoustic or ultrasonic band frequency are also readily implemented with the low mass highly coupled flex circuit actuators.

As noted above, the piezo element need not be a stiff ceramic element, and if the flex circuit is to be used only as a sensor, then either a ceramic element, or a soft material such as PVDF may be employed. In the case of the polymer, a thinner more pliant low temperature adhesive is used for coupling the element, rather than a hard curable epoxy bonding layer.

Exemplified below is an embodiment of the invention.

EXAMPLE

Figure 15B:
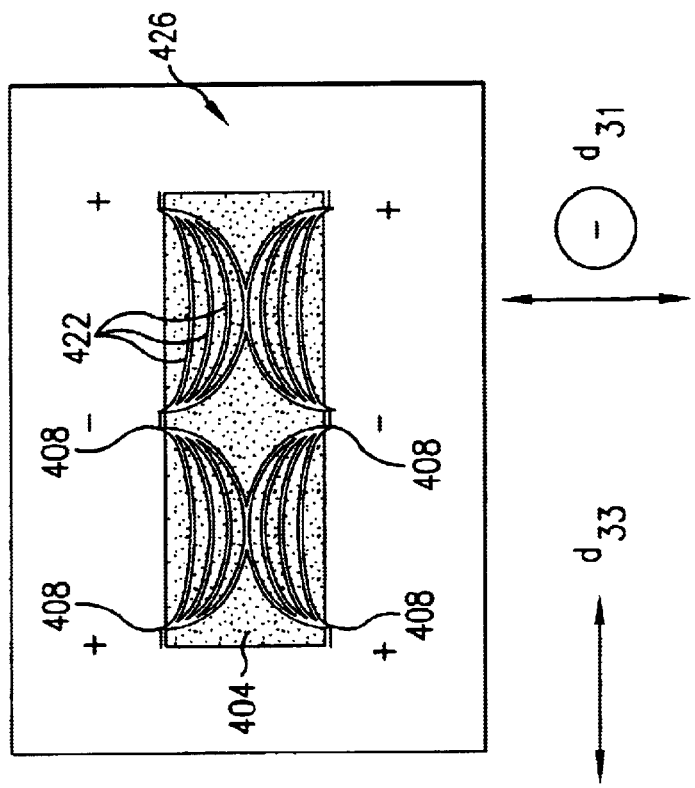
FIG. 15B shows electrical field lines for an embodiment of a piezoelectric device having interdigital electrodes.
Figure 15A:
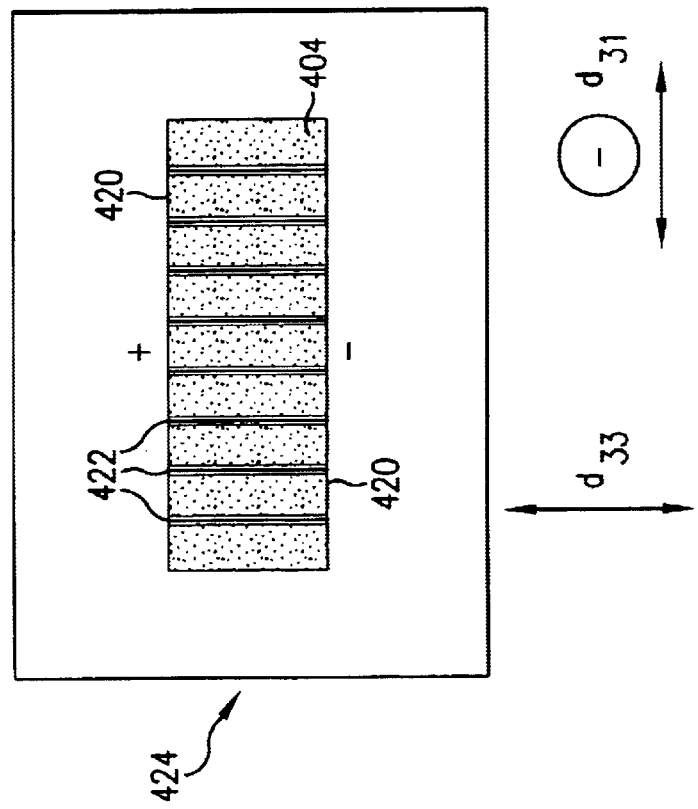
FIG. 15A shows electrical field lines for piezoelectric device having a piezoceramic plate with solid electrodes on both surfaces of the plate.

Devices comprising fine line interdigital electrodes (IDE) function using the principles of surface acoustic wave (SAW) propagation through solids and are sometimes referred to as interdigital transducers (IDT). A majority of the IDT's presently in use are operated using low electric field, high frequency propagation waves instead of high field, low frequency waves. The latter conditions are necessary for actuation and damping applications. The principles behind IDE permit the device to make use of the more efficient $d_{33}$ properties (i.e., such as when the force is in the 3 direction along the polarization axis and is impressed on the same surface on which the charge is collected) for in-plane actuation or damping instead of the more commonly used $d_{31}$ properties (i.e., such as when the charge is collected on the same surface as before, but the force is applied at right angles to the polarization axis). This is accomplished by arranging the electrodes so that the poling and excitation fields run largely parallel to the plane of actuation. FIG. 15A shows the field lines 422 of a $d_{31}$ device 424 having a solid electrode 420 located on the top and bottom surfaces of a piezoceramic plate 404; FIG. 15B shows the filed lines 422 of a $d_{33}$ IDE device 426 having interlocking line electrodes 408. The electromechanical properties in the $d_{33}$ direction are generally more than twice those in $d_{31}$ direction.

Line IDE devices have been successful for some low field applications. However, when large fields are applied during poling or excitation, internal cracks or electrical shorts sometimes result These. failures are due to internal stresses caused by the non-uniform electrical field in the material near the ends of the electrodes. It is also apparent that the electrode line connecting the interdigital lines on the surface of the piezoceramic creates additional stress concentrations. Line IDE patterns have also been used in the construction of piezoelectric fiber composite devices where stress concentrations do not occur.

Interdigital electrode monolithic thin plate piezoelectric devices were developed utilizing methods described herein (hereinafter referred to singularly as "the IDE device"). The results are compared to a piezoelectric device that uses a $d_{31}$ piezoceramic plate with solid electrodes on both surfaces of the plate (hereinafter "the solid electrode device"). Electrical and mechanical energy calculations and experimental results of resonance measurements were used to quantify and compare the electromechanical coupling coefficients and damping capabilities of these devices.

Both the solid electrode and IDE devices were fabricated using a PZT-5A type material with dimensions 46.05 mm×20.65 mm×0.254 mm. The ratios of the dimensions of the piezoceramic thickness and electrodes of an IDE device are important, but the determination of optimum values depends on application-specific requirements including displacement, generative strain force, and available drive voltage. A representative design was selected in which the IDE device electrode pattern consisted of 0.38 mm lines on a 1.52 mm pitch. The piezoceramic material and electrodes were packaged in a protective polyimide skin with pre-attached electrical leads.

1. Vibration Damper Experiment

Damping experiments were constructed using the IDE and solid electrode devices bonded to aluminum beams. The beams were 229.0 mm×31.8 mm×2.3 mm with a clamped free length of 133.0 mm. The devices were bonded to one surface of the aluminum beam 6.35 mm away from the clamp edge. The tip motion due to an initial displacement was measured with a laser displacement sensor. Damping was computed from the ring down of tip displacement using the logarithmic decrement method. Damping measurements were taken for the following configurations: bare beam, beams with RC shunted IDE and solid electrode devices, and beams with un-shunted IDE and solid electrode devices. A second method for measuring the damping of the system was used to validate the logarithmic decrement results. In this method, a swept sinusoidal excitation was applied to the beam using an electromechanical shaker attached to the beam through a load cell and the damping was computed from the transfer function measured from the applied load to the tip displacement.

A fairly large scatter in the percentage of critical damping measured in the response of the beams as a function of the average strain on the surface of the devices bonded to the aluminum beams was observed due to the difficulty associated with consistently exciting the beams at their first resonant mode. The shunted IDE device was shown to provide more than twice the damping achieved by the shunted solid electrode device when compared to either unshunted device bonded to a beam.

2. Generative Strain and Modulus Experiments

The free-free strain generated by the IDE and solid electrode devices was measured with strain gages bonded to both surfaces of the devices. In addition to high strains, piezoceramic devices have the ability to generate very high forces as well, due to their inherently high material modulus. Measurement of the modulus is very difficult especially under high field excitation. Low field measurements are useful as a general indicator of the modulus, though caution must be exercised when applying these measurements to predictions of high field AC performance. The device modulus may be determined by measuring the strain under a known mechanical stress. In this way, stress-strain curves can be generated to quantify the modulus as a function of applied electric field.

In this experiment, a known mechanical stress was applied by bonding sheets of aluminum to both sides of the device. Due to the symmetry of the construction, the in-plane strain was uniform through the thickness of the device except near the edges. Given the measured strain and the modulus of the aluminum (68.8 GPa), the stress in the aluminum can be determined from Hook's law. Neglecting the presence of the thin, low modulus bond layers the product of stress and thickness in the piezoceramic layer is equal and opposite to the same product in the aluminum layer. Strain measurements taken from the surface of the aluminum can therefore be used to find the stress in the device. Performing these measurements with aluminum sheets of different thicknesses allows for the calculation of device modulus under different electrical field and mechanical strain levels.

The free strain of the devices was measured at room temperature by averaging the signals from strain gages applied to both surfaces of the devices. The applied drive signal was a 1 Hz sine wave; the maximum voltage was +/−600 Volts (1200 $V_{p-p}$) for the IDE device and +/−100 Volts (200 $V_{p-p}$) for the solid electrode device. The applied electric field was calculated based on the 0.254 mm spacing between the electrode planes for the solid electrode device, and the 1.524 mm between the electrode lines for the IDE device. Because the field in the IDE device is non-uniform, the value calculated in this way should be considered an average or nominal value. The strain output of the IDE device is approximately 70% higher than that of the solid electrode device for a comparable field strength.

For comparative purposes, Table 1 presents the measured low field piezoelectric strain constants ($d_{31}$ and $d_{33}$) for the unpackaged PZT 5A material as well as the high field (8 kV/cm) strain constants for the IDE and solid electrode devices. While the piezoelectric constant values are actually non-linear as a function of field and heavily dependent upon the form of the excitation signal (wave form, drive frequency, DC offset, etc.) the comparison is still useful. The high field $d_{31}$ constant for the solid electrode device actuator was higher than the low field constant for the unpackaged material. The strain constant of the IDE device actuator was approximately 10% lower than the $d_{33}$ constant of the unpackaged material. This is due to the fact that the field in IDE devices is not exactly equivalent to that in a $d_{33}$ device.

TABLE 1

Comparison of Piezoelectric Strain Constants ($d_{31}$ and $d_{33}$)

| | $d_{31}$ | | $d_{33}$ |
|---|---|---|---|
| Unpackaged PZT @ low field | 180 pm/V | Unpackaged PZT @ low field | 350 pm/V |
| solid electrode device @ 8 kV/cm | 191 pm/V | IDE device @ 8 kV/cm | 318 pm/V |

The constrained strain and elastic modulus was measured using aluminum layers of 0.0375 mm, 0.0750 mm, and 0.1250 mm thickness were bonded to both sides of an unpackaged piezoceramic plate as well as to the solid electrode and IDE devices. Data points representing the calculated stress versus strain of the unpackaged piezoceramic plate for varying thicknesses of aluminum constraining layers were acquired for four different field levels (2 kV/cm, 4 kV/cm, 6 kV/cm, and 8 kV/cm). The elastic modulus is obtained from the slope of the lines connecting data points obtained at a specific field level. Similar measurements were made for the IDE and solid electrode devices.

3. Electromechanical Coupling Factor

The electromechanical coupling coefficient is useful for quantifying the performance of a piezoelectric device. It is a non-dimensional parameter calculated from the electrical and mechanical energy of the system. It can be found from $$k^2 = \frac{W_M}{W_B} = \frac{\frac{1}{2}(\text{modulus})(\text{volume})(\text{strain})^2}{\frac{1}{2}(\text{capacitance})(\text{voltage})^2} \quad (1)$$

where the mechanical energy output of a device is represented by $W_M$ and the electrical energy input to the system is represented by $W_E$. Alternatively, it can be computed from $$k_{31} = \sqrt{\left(\frac{\pi f_a}{2f_r}\tan\left(\frac{\pi(f_a - f_r)}{2f_r}\right)\right) / \left(1 + \frac{\pi f_a}{2f_r}\tan\left(\frac{\pi(f_a - f_r)}{2f_r}\right)\right)} \quad (2)$$

where $f_a$ and $f_r$ are the antiresonance and resonance frequencies measured with and impedance analyzer. However, equation 2 is only strictly accurate if the samples are bar shaped and satisfy the condition: (length/width)$^2$>10. If this condition is not satisfied, the results can only be used for comparing devices of similar shape.

Table 2 contains calculated values for the electromechanical coupling coefficients determined using both methods described above. The estimate based on equation 1 yields a coupling coefficient of 0.71 for the IDE device and 0.32 for the solid electrode device at an applied field of 8 kV/cm. The impedance plots, measured using an HP impedance analyzer (model 4194A), used to find resonance and antiresonance frequencies used in equation 2. The value of (length/width) for the devices was approximately equal to five; since it was not greater than 10, the values obtained from equation 2 should only be used for comparative purposes. The estimate based on equation 2 indicates that the coupling coefficient of the IDE device is approximately 65% higher than that of the solid electrode device.

TABLE 2

Calculated $k_{eff}$ using energy method (equation 1) and resonance method (equation 2).

| | solid electrode device | IDE device |
|---|---|---|
| Energy Method | | |
| 4 kV/cm | 0.29 | 0.65 |
| 8 kV/cm | 0.32 | 0.71 |
| Resonance Method | | |
| Low field | 0.29 | 0.49 |

Thus, in summary, electromechanical coupling coefficients calculated using two different methods showed that values of 0.45 to 0.71 were achieved for IDE devices as compared to 0.29 to 0.35 for $d_{31}$ devices. In addition, experimental results are provided that compare the damping and actuation performance of $d_{31}$ devices with the performance of IDE devices. Resistively shunted IDE damper devices achieved greater than a factor of two in improvement in added damping over conventional PZT dampers. Furthermore, the high field generative strain of IDE actuators was shown to be 70% greater than that produced by a $d_{31}$ actuator.

The foregoing description of methods of manufacture and illustrative embodiments is presented to indicate the range of constructions to which the invention applies. The invention having overcome numerous drawbacks in the fragility, circuit configuration and general utility of strain actuators, strain activated assemblies and sensors, other variations in the physical architecture and practical applications of the modular flex circuit actuators and sensors of the invention will occur to those skilled in the art, and such variations are considered to be within the scope of the invention in which patent rights are asserted, as set forth in the claims appended hereto.

What is claimed is:

1. An actuator device comprising:
    a first and a second electro-active element each in plate form and mounted between two sheets of a stiff strong polymer, at least one of said sheets, defining a contact sheet, having a thickness of between one half mil and two mil and being clad with an electrode material on both sides; and
    a first and a second conductor,
    wherein said first conductor is in direct electrical contact with said first electro-active element through said contact sheet; and second conductor is in direct electrical contact with said second electro-active element through said contact sheet; and
    wherein said first and second electro-active elements and said conductors are arranged such that said device forms a generally sigmoidal shape upon activation of said first and second electro-active elements;
    wherein said first and second electro-active elements are bonded to said electrode sheet with a structural polymer to form a sealed card, and
    wherein said structural polymer and said two sheets of stiff strong polymer provides a bending stiffness sufficient to prevent deformation of the card to a breaking point and mechanical stiffness such that shear forces are efficiently coupled from the card to a workpiece.

* * * * *